(12) United States Patent
Lunt, III et al.

(10) Patent No.: US 12,336,322 B2
(45) Date of Patent: Jun. 17, 2025

(54) TRANSPARENT LUMINESCENT SOLAR CONCENTRATOR

(71) Applicant: Board of Trustees of Michigan State University, East Lansing, MI (US)

(72) Inventors: Richard R. Lunt, III, Williamston, MI (US); Chenchen Yang, Holt, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 279 days.

(21) Appl. No.: 17/277,807

(22) PCT Filed: Sep. 23, 2019

(86) PCT No.: PCT/US2019/052436
§ 371 (c)(1),
(2) Date: Mar. 19, 2021

(87) PCT Pub. No.: WO2020/068670
PCT Pub. Date: Apr. 2, 2020

(65) Prior Publication Data
US 2021/0351312 A1    Nov. 11, 2021

Related U.S. Application Data

(60) Provisional application No. 62/735,433, filed on Sep. 24, 2018.

(51) Int. Cl.
*H10F 77/42* (2025.01)
*H10F 77/45* (2025.01)

(52) U.S. Cl.
CPC ........... *H10F 77/484* (2025.01); *H10F 77/45* (2025.01); *H10F 77/488* (2025.01); *Y02E 10/52* (2013.01)

(58) Field of Classification Search
CPC ............. H01L 31/0543; H01L 31/0547; H01L 31/055; G02B 6/0003; G02B 6/0025;
(Continued)

(56) References Cited

U.S. PATENT DOCUMENTS

| 4,155,371 A | 5/1979 | Wohlmut et al. |
| 4,159,212 A | 6/1979 | Yerkes |

(Continued)

FOREIGN PATENT DOCUMENTS

| CN | 103534831 A | 1/2014 |
| EP | 2693503 A1 | 2/2014 |

(Continued)

OTHER PUBLICATIONS

Office Action for Japanese Application 2022114145, dated Aug. 29, 2023, with English language translation (5 pages).

(Continued)

*Primary Examiner* — Golam Mowla
(74) *Attorney, Agent, or Firm* — Harness, Dickey & Pierce, PLC

(57) ABSTRACT

A solar concentrator device is provided. The solar concentrator device includes a waveguide having a luminophore and a first refractive index; a photovoltaic component operably coupled to the waveguide; and a film disposed onto a surface of the waveguide, the film having a second refractive index. The second refractive index of the film is lower than the first refractive index of the waveguide. The waveguide and the film are visibly transparent.

32 Claims, 12 Drawing Sheets

(58) Field of Classification Search
CPC ..... G02B 6/0076; H10F 77/45; H10F 77/484; H10F 77/488; C09K 11/06; C09K 2211/1029
See application file for complete search history.

(56) References Cited

U.S. PATENT DOCUMENTS

| | | | |
|---|---|---|---|
| 4,357,486 | A | 11/1982 | Blieden et al. |
| 5,180,888 | A * | 1/1993 | Sugiyama ............... H01R 4/04 252/514 |
| 10,510,914 | B2 | 12/2019 | Lunt, III et al. |
| 11,688,818 | B2 | 6/2023 | Lunt, III et al. |
| 2002/0165477 | A1* | 11/2002 | Dunshee ............ A61F 13/0203 602/54 |
| 2003/0227517 | A1 | 12/2003 | Yaron |
| 2005/0031839 | A1* | 2/2005 | Mizutani ................. B32B 27/08 428/212 |
| 2006/0112983 | A1 | 6/2006 | Parce et al. |
| 2007/0116628 | A1 | 5/2007 | Shew et al. |
| 2007/0297988 | A1 | 12/2007 | Wu |
| 2008/0072960 | A1 | 3/2008 | Kim et al. |
| 2009/0027872 | A1 | 1/2009 | Debije et al. |
| 2009/0032083 | A1 | 2/2009 | Torrance et al. |
| 2009/0056791 | A1* | 3/2009 | Pfenninger .......... H01L 31/055 136/247 |
| 2009/0126778 | A1 | 5/2009 | Brounne et al. |
| 2009/0159801 | A1 | 6/2009 | Knapp et al. |
| 2009/0229652 | A1 | 9/2009 | Mapel et al. |
| 2009/0277500 | A1 | 11/2009 | Wong et al. |
| 2010/0139749 | A1 | 6/2010 | Mapel |
| 2010/0180932 | A1 | 7/2010 | Wang et al. |
| 2010/0288352 | A1 | 11/2010 | Ji et al. |
| 2010/0313875 | A1 | 12/2010 | Kennedy |
| 2010/0326496 | A1 | 12/2010 | Bhattacharya et al. |
| 2011/0063392 | A1 | 3/2011 | Wu et al. |
| 2011/0086302 | A1 | 4/2011 | Zhou et al. |
| 2011/0232211 | A1 | 9/2011 | Farahi |
| 2012/0118381 | A1* | 5/2012 | Debije ................... G02B 6/004 362/621 |
| 2012/0186623 | A1 | 7/2012 | Bulovic et al. |
| 2013/0025679 | A1* | 1/2013 | Maeda ................. H01L 31/055 257/E31.127 |
| 2013/0087193 | A1 | 4/2013 | Yui et al. |
| 2013/0104983 | A1 | 5/2013 | Abrams et al. |
| 2013/0174896 | A1 | 7/2013 | Ardo et al. |
| 2013/0230464 | A1 | 9/2013 | Yi et al. |
| 2013/0333755 | A1 | 12/2013 | Lunt et al. |
| 2014/0018425 | A1 | 1/2014 | Hsu et al. |
| 2014/0130864 | A1 | 5/2014 | Lunt et al. |
| 2014/0283896 | A1* | 9/2014 | Lunt, III ............. H01L 31/0549 136/247 |
| 2015/0194555 | A1* | 7/2015 | Zhang ................... H01L 31/048 250/487.1 |
| 2018/0182910 | A1* | 6/2018 | Paire ................... H01L 31/0547 |
| 2021/0230427 | A1 | 7/2021 | Lunt, III et al. |
| 2023/0282756 | A1 | 9/2023 | Lunt, III et al. |

FOREIGN PATENT DOCUMENTS

| | | |
|---|---|---|
| JP | 2001-060497 A | 3/2001 |
| JP | 2001076877 A | 3/2001 |
| JP | 2002108259 A | 4/2002 |
| JP | 2003269317 A | 9/2003 |
| JP | 2004252304 A | 9/2004 |
| JP | 2005503453 A | 2/2005 |
| JP | 2005-136531 A | 5/2005 |
| JP | 2008-181688 A | 8/2008 |
| JP | 2009512122 A | 3/2009 |
| JP | 2010258020 A | 11/2010 |
| JP | 2011505479 A | 2/2011 |
| JP | 2012510717 A | 5/2012 |
| JP | 2012-526212 A | 10/2012 |
| JP | 2012532135 A | 12/2012 |
| JP | 2013109076 A | 6/2013 |
| JP | 2013526008 A | 6/2013 |
| JP | 2013529372 A | 7/2013 |
| JP | 2013187349 A | 9/2013 |
| JP | 2013535799 A | 9/2013 |
| JP | 2014505370 A | 2/2014 |
| JP | 2014049631 A | 3/2014 |
| TW | 201115763 A | 5/2011 |
| WO | WO-2004-084272 A2 | 9/2004 |
| WO | WO-2005073342 A1 | 8/2005 |
| WO | WO-2007-035466 A2 | 3/2007 |
| WO | WO-2009-002943 A2 | 12/2008 |
| WO | WO-2009-011188 A1 | 1/2009 |
| WO | WO-2009-091773 A2 | 7/2009 |
| WO | WO-2011074295 A1 | 6/2011 |
| WO | WO-2011-158568 A1 | 12/2011 |
| WO | WO-2013-003894 A1 | 1/2013 |
| WO | WO-2013003890 A1 | 1/2013 |
| WO | WO-2013-167224 A1 | 11/2013 |
| WO | WO-2013-171517 A1 | 11/2013 |
| WO | WO-2015185855 A1 * | 12/2015 ......... H01L 31/0547 |
| WO | WO-2018203245 A1 | 11/2018 |

OTHER PUBLICATIONS

Extended European Search report for EP Application 221963911, dated Sep. 18, 2023 (8 pages).
Chinese Office Action for corresponding CN Application 201980069470.4 dated Oct. 26, 2023, with English language translation (21 pages).
Chinese Office Action for corresponding CN Application 201980069470.4 dated Aug. 29, 2022 with English Language Translation (21 pages).
Chinese Office Action for corresponding CN Application 201980069470.4 dated May 11, 2023 with English Language Translation (22 pages).
Extended European Search Report for EP Application 19866428.6 dated Jul. 4, 2022.
International Preliminary Report on Patentability from corresponding International Application PCT/US2019/052436, dated Mar. 23, 2021 (10 pages).
International Search Report and Written Opinion from corresponding PCT Application PCT/US2019/052436, dated Feb. 3, 2020.
Lunt, R. R.; Osedach, T. P.; Brown, P. R.; Rowehl, J. A.; Bulović, V. Practical Roadmap and Limits to Nanostructured Photovoltaics. *Adv. Mater.* 2011, 23 (48), 5712-5727.
Lunt, R. R. Theoretical Limits for Visibly Transparent Photovoltaics. *Applied Physics Letters.* 2012.
Traverse, C. J.; Pandey, R.; Barr, M. C.; Lunt, R. R. Emergence of Highly Transparent Photovoltaics for Distributed Applications. *Nat. Energy* 2017, 2 (11), 849-860.
Lunt, R. R.; Bulovic, V. Transparent, near-Infrared Organic Photovoltaic Solar Cells for Window and Energy-Scavenging Applications. *Appl. Phys. Lett.* 2011, 98 (11), 3-5.
Yang, C.; Lunt, R. R. Limits of Visibly Transparent Luminescent Solar Concentrators. *Adv. Opt. Mater.* 2017, 5 (8), 1600851.
Zhao, Y.; Meek, G. A.; Levine, B. G.; Lunt, R. R. Near-Infrared Harvesting Transparent Luminescent Solar Concentrators. *Adv. Opt. Mater.* 2014, 2 (7), 606-611.
Erickson, C. S.; Bradshaw, L. R.; McDowall, S.; Gilbertson, J. D.; Gamelin, D. R.; Patrick, D. L. Zero-Reabsorption Doped-Nanocrystal Luminescent Solar Concentrators. *ACS Nano* 2014, 8 (4), 3461-3467.
Coropceanu, I.; Bawendi, M. Core/Shell Quantum Dot Based Luminescent Solar Concentrators with Reduced Reabsorption and Enhanced Efficiency. *Nano Lett.* 2014.
Zhao, H.; Benetti, D.; Jin, L.; Zhou, Y.; Rosei, F.; Vomiero, A. Absorption Enhancement in "Giant" Core/Alloyed-Shell Quantum Dots for Luminescent Solar Concentrator. *Small* 2016.
Knowles, K. E.; Kilburn, T. B.; Alzate, D. G.; McDowall, S.; Gamelin, D. R. Bright CuInS2/CdS Nanocrystal Phosphors for High-Gain Full-Spectrum Luminescent Solar Concentrators. *Chem. Commun.* 2015, 51 (44), 9129-9132.
Bergren, M. R.; Makarov, N. S.; Ramasamy, K.; Jackson, A.; Guglielmetti, R.; McDaniel, H. High-Performance CuInS2 Quan-

(56) References Cited

OTHER PUBLICATIONS tum Dot Laminated Glass Luminescent Solar Concentrators for Windows. ACS Energy Lett. 2018, 520-525.
Li, C.; Chen, W.; Wu, D.; Quan, D.; Zhou, Z.; Hao, J.; Qin, J.; Li, Y.; He, Z.; Wang, K. Large Stokes Shift and High Efficiency Luminescent Solar Concentrator Incorporated with CuInS2/ZnS Quantum Dots. Sci. Rep. 2015, 5, 17777.
Sharma, M.; Gungor, K.; Yeltik, A.; Olutas, M.; Guzelturk, B.; Kelestemur, Y.; Erdem, T.; Delikanli, S.; McBride, J. R.; Demir, H. V. Near-Unity Emitting Copper-Doped Colloidal Semiconductor Quantum Wells for Luminescent Solar Concentrators. Adv. Mater. 2017, 29 (30), 1700821.
Sheng, X.; Yu, C.; Malyarchuk, V.; Lee, Y.; Kim, S.; Kim, T.; Shen, L.; Horng, C.; Lutz, J.; Giebink, N. C.; et al. Silicon-Based Visible-Blind Ultraviolet Detection and Imaging Using Down-Shifting Luminophores. Adv. Opt. Mater. 2014, 2 (4), 314-319.
Zhang, J .; Badger, P. D .; Geib, S. J .; Petoud, S. Sensitization of Near-Infrared-Emitting Lanthanide Cations in Solution by Tropolonate Ligands. Angew. Chemie Int. Ed. 2005, 44 (17), 2508-2512.
Ronda, C. R.; Justel, T.; Nikol, H. Rare Earth Phosphors: Fundamentals and Applications. J. Alloys Compd. 1998, 275-277, 669-676.
Saengkerdsub, S.; Im, H.-J.; Willis, C.; Dai, S. Pechini-Type in-Situ Polymerizable Complex (IPC) Method Applied to the Synthesis of Y2O3:Ln (Ln = Ce or Eu) Nanocrystallites. J. Mater. Chem. 2004, 14 (7), 1207-1211.
Sanguineti, A.; Monguzzi, A.; Vaccaro, G.; Meinardi, F.; Ronchi, E.; Moret, M.; Cosentino, U.; Moro, G.; Simonutti, R.; Mauri, M.; et al. NIR Emitting Ytterbium Chelates for Colourless Luminescent Solar Concentrators. Phys. Chem. Chem. Phys. 2012, 14 (18), 6452-6455.
Sun, L.-N.; Yu, J.-B.; Zhang, H.-J.; Meng, Q.-G.; Ma, E.; Peng, C.-Y.; Yang, K.-Y. Near-Infrared Luminescent Mesoporous Materials Covalently Bonded with Ternary Lanthanide [Er(III), Nd(III), Yb(III), Sm(III), Pr(III)] Complexes. Microporous Mesoporous Mater. 2007, 98 (1-3), 156-165.
Reisfeld, R .; Kalisky, Y. Nd3+ and Yb3+ Germanate and Tellurite Glasses for Fluorescent Solar Energy Collectors. Chem. Phys. Lett. 1981, 80 (1), 178-183.
Wang, T.; Zhang, J.; Ma, W.; Luo, Y.; Wang, L.; Hu, Z.; Wu, W.; Wang, X.; Zou, G.; Zhang, Q. Luminescent Solar Concentrator Employing Rare Earth Complex with Zero Self-Absorption Loss. Sol. Energy 2011, 85 (11), 2571-2579.
Chengelis, D. A.; Yingling, A. M.; Badger, P. D.; Shade, C. M.; Petoud, S. Incorporating Lanthanide Cations with Cadmium Selenide Nanocrystals: A Strategy to Sensitize and Protect Tb(III). J. Am. Chem. Soc. 2005, 127 (48), 16752-16753.
Sokolov, M. N.; Mihailov, M. A.; Peresypkina, E. V; Brylev, K. A.; Kitamura, N.; Fedin, V. P. Highly Luminescent Complexes [Mo6X8(n-C3F7COO)6]2- (X = Br, I). Dalt. Trans. 2011, 40 (24), 6375-6377.
Kuttipillai, P. S.; Zhao, Y.; Traverse, C. J.; Staples, R. J.; Levine, B. G.; Lunt, R. R. Phosphorescent Nanocluster Light-Emitting Diodes. Adv. Mater. 2016, 28 (2), 320-326.
Bradshaw, L. R.; Knowles, K. E.; McDowall, S.; Gamelin, D. R. Nanocrystals for Luminescent Solar Concentrators. Nano Lett. 2015, 15 (2), 1315-1323.
Mansour, A. F.; Killa, H. M. A.; Abd El-Wanees, S.; El-Sayed, M. Y. Laser Dyes Doped with Poly(ST-Co-MMA) as Fluorescent Solar Collectors and Their Field Performance. Polym. Test. 2005, 24 (4), 519-525.
Reisfeld, R.; Brusilovsky, D.; Eyal, M.; Miron, E.; Burstein, Z.; Ivri, J. A New Solid-State Tunable Laser in the Visible. Chem. Phys. Lett. 1989, 160 (1), 43-44.
Debije, M. G.; Verbunt, P. P. C.; Nadkarni, P. J.; Velate, S.; Bhaumik, K.; Nedumbamana, S.; Rowan, B. C.; Richards, B. S.; Hoeks, T. L. Promising Fluorescent Dye for Solar Energy Conversion Based on a Perylene Perinone. Appl. Opt. 2011, 50 (2), 163-169.
Swartz, B. A.; Cole, T.; Zewail, A. H. Photon Trapping and Energy Transfer in Multiple-Dye Plastic Matrices: An Efficient Solar-Energy Concentrator. Opt. Lett. 1977, 1 (2), 73-75.

Kubin, R. F.; Fletcher, A. N. Fluorescence Quantum Yields of Some Rhodamine Dyes. J. Lumin. 1982, 27 (4), 455-462.
Weber, W. H.; Lambe, J. Luminescent Greenhouse Collector for Solar Radiation. Appl. Opt. 1976, 15 (10), 2299-2300.
Currie, M. J.; Mapel, J. K.; Heidel, T. D.; Goffri, S.; Baldo, M. A. High-Efficiency Organic Solar Concentrators for Photovoltaics. Science (80-. ). 2008, 321 (5886), 226 LP-228.
Slooff, L. H.; Bende, E. E.; Burgers, a. R.; Budel, T.; Pravettoni, M.; Kenny, R. P.; Dunlop, E. D.; Büchtemann, a. A Luminescent Solar Concentrator with 7.1% Power Conversion Efficiency. Phys. Status Solidi—Rapid Res. Lett. 2008, 2 (6), 257-259.
Zhou, Y.; Benetti, D.; Fan, Z.; Zhao, H.; Ma, D.; Govorov, A. O.; Vomiero, A.; Rosei, F. Near Infrared, Highly Efficient Luminescent Solar Concentrators. Adv. Energy Mater. 2016, 6 (11), 1501913.
Banal, J. L.; Zhang, B.; Jones, D. J.; Ghiggino, K. P.; Wong, W. W. H. Emissive Molecular Aggregates and Energy Migration in Luminescent Solar Concentrators. Acc. Chem. Res. 2017, 50 (1), 49-57.
Banal, J. L.; Soleimaninejad, H.; Jradi, F. M.; Liu, M.; White, J. M.; Blakers, A. W.; Cooper, M. W.; Jones, D. J.; Ghiggino, K. P.; Marder, S. R.; et al. Energy Migration in Organic Solar Concentrators with a Molecularly Insulated Perylene Diimide. J. Phys. Chem. C 2016, 120 (24), 12952-12958.
Banal, J. L.; White, J. M.; Ghiggino, K. P.; Wong, W. W. H. Concentrating Aggregation-Induced Fluorescence in Planar Waveguides: A Proof-of-Principle. Sci. Rep. 2014, 4, 4635.
Walheim, S.; Schaffer, E.; Mlynek, J.; Steiner, U. Nanophase-Separated Polymer Films as High-Performance Antireflection Coatings. Science (80-. ). 1999, 283 (5401), 520 LP-522.
Sydlik, S. A.; Chen, Z.; Swager, T. M. Triptycene Polyimides: Soluble Polymers with High Thermal Stability and Low Refractive Indices. Macromolecules 2011, 44 (4), 976-980.
Groh, W.; Zimmermann, A. What Is the Lowest Refractive Index of an Organic Polymer? Macromolecules 1991, 24 (25), 6660-6663.
Schubert, E. F.; Kim, J. K. Low-Refractive-Index Materials: A New Class of Optical Thin-Film Materials. In 2007 International Conference on Numerical Simulation of Optoelectronic Devices; 2007; pp. 1-2.
Xi, J.-Q.; Kim, J. K.; Schubert, E. F.; Ye, D.; Lu, T.-M.; Lin, S.-Y.; Juneja, J. S. Very Low-Refractive-Index Optical Thin Films Consisting of an Array of SiO2 Nanorods. Opt. Lett. 2006, 31 (5), 601-603.
Yan, X.; Poxson, D. J.; Cho, J.; Welser, R. E.; Sood, A. K.; Kim, J. K.; Schubert, E. F. Enhanced Omnidirectional Photovoltaic Performance of Solar Cells Using Multiple-Discrete-Layer Tailored- and Low-Refractive Index Anti-Reflection Coatings. Adv. Funct. Mater. 2012, 23 (5), 583-590.
Guillemot, F.; Brunet-Bruneau, A.; Bourgeat-Lami, E.; Gacoin, T.; Barthel, E.; Boilot, J. P. Latex-Templated Silica Films: Tailoring Porosity to Get a Stable Low-Refractive Index. Chem. Mater. 2010, 22 (9), 2822-2828.
Xi, J.-Q.; Ojha, M.; Cho, W.; Plawsky, J. L.; Gill, W. N.; Gessmann, T.; Schubert, E. F. Omnidirectional Reflector Using Nanoporous SiO2 as a Low-Refractive-Index Material. Opt. Lett. 2005, 30 (12), 1518-1520.
Xi, J.-Q.; Schubert, M. F.; Kim, J. K.; Schubert, E. F.; Chen, M.; Lin, S.-Y.; Liu, W.; Smart, J. A. Optical Thin-Film Materials with Low Refractive Index for Broadband Elimination of Fresnel Reflection. Nat. Photonics 2007, 1, 176.
Xi, J.-Q.; Kim, J. K.; Schubert, E. F. Silica Nanorod-Array Films with Very Low Refractive Indices. Nano Lett. 2005, 5 (7), 1385-1387.
Falcaro, P.; Grosso, D.; Amenitsch, H.; Innocenzi, P. Silica Orthorhombic Mesostructured Films with Low Refractive Index and High Thermal Stability. J. Phys. Chem. B 2004, 108 (30), 10942-10948.
Schubert, M. F.; Xi, J.-Q.; Kim, J. K.; Schubert, E. F. Distributed Bragg Reflector Consisting of High- and Low-Refractive-Index Thin Film Layers Made of the Same Material. Appl. Phys. Lett. 2007, 90 (14), 141115.
Xu, L.; Yao, Y.; Bronstein, N. D.; Li, L.; Alivisatos, A. P.; Nuzzo, R. G. Enhanced Photon Collection in Luminescent Solar Concentrators with Distributed Bragg Reflectors. ACS Photonics 2016, 3 (2), 278-285.

(56) References Cited

OTHER PUBLICATIONS

Liu, J.; Ueda, M. High Refractive Index Polymers: Fundamental Research and Practical Applications. *J. Mater. Chem.* 2009, *19* (47), 8907-8919.
Badur, T.; Dams, C.; Hampp, N. High Refractive Index Polymers by Design. *Macromolecules* 2018, *51* (11), 4220-4228.
You, N.-H.; Higashihara, T.; Oishi, Y.; Ando, S.; Ueda, M. Highly Refractive Poly(Phenylene Thioether) Containing Triazine Unit. *Macromolecules* 2010, *43* (10), 4613-4615.
Griebel, J. J.; Namnabat, S.; Kim, E. T.; Himmelhuber, R.; Moronta, D. H.; Chung, W. J.; Simmonds, A. G.; Kim, K.-J.; van der Laan, J.; Nguyen, N. A.; et al. New Infrared Transmitting Material via Inverse Vulcanization of Elemental Sulfur to Prepare High Refractive Index Polymers. *Adv. Mater.* 2014, *26* (19), 3014-3018.
Okutsu, R.; Suzuki, Y.; Ando, S.; Ueda, M. Poly(Thioether Sulfone) with High Refractive Index and High Abbe's Number. *Macromolecules* 2008, *41* (16), 6165-6168.
Higashihara, T.; Ueda, M. Recent Progress in High Refractive Index Polymers. *Macromolecules* 2015, *48* (7), 1915-1929.
Javadi, A.; Shockravi, A.; Rafieimanesh, A.; Malek, A.; Ando, S. Synthesis and Structure- property Relationships of Novel Thiazole-Containing Poly(Amide Imide)s with High Refractive Indices and Low Birefringences. *Polym. Int.* 2014, *64* (4), 486-495.
International Search Report regarding International Application No. PCT/US2015/021257, dated Jun. 25, 2015.
Written Opinion of the International Searching Authority regarding International Application No. PCT/US2015/021257, dated Jun. 25, 2015.
International Preliminary Report on Patentability regarding International Application No. PCT/US2015/021257, dated Sep. 20, 2016.
Office Action regarding Chinese Patent Application No. 201580015157.4, dated Jul. 20, 2017. Translation provided by Shanghai Beshining Law Office.
Search Report regarding European Patent Application No. 15764966.6, dated Nov. 20, 2017.
Office Action regarding European Patent Application No. 15764966.6, dated Jul. 16, 2018.
Office Action regarding Japanese Patent Application No. 2017-501095, dated Feb. 19, 2019. Translation provided by Harakenzo World Patent and Trademark.
Office Action regarding Japanese Patent Application No. 2017-501095, dated Jul. 16, 2019. Translation provided by Harakenzo World Patent and Trademark.
Office Action regarding European Patent Application No. 15764966.6, dated Sep. 27, 2019.
Office Action regarding European Patent Application No. 15764966.6, dated May 14, 2020.
Office Action regarding Japanese Patent Application No. 2020-003658, dated Jan. 12, 2021. Translation provided by Harakenzo World Patent and Trademark.
Office Action regarding European Patent Application No. 15764966.6, dated Jan. 22, 2021.
Barnham, Keith et al., "Quantum-dot concentrator and thermodynamic model for the global redshift." Applied Physics Letters, vol. 76, No. 9, pp. 1197-1199 (2000).
Batchelder, J. S. et al., "Luminescent solar concentrators. 1: Theory of operation and techniques for performance evaluation." Applied Optics, vol. 18, No. 18, pp. 3090-3110 (1979).
Batchelder, J. S. et al., "Luminescent solar concentrators. 2: Experimental and theoretical analysis of their possible efficiencies." Applied Optics, vol. 20, No. 21, pp. 3733-3754 (1981).
Bertolino, Chiara A. et al., "Novel Heptamethine Cyanine Dyes with Large Stokes' Shift for Biological Applications in the Near Infrared." Journal of Fluorescence, vol. 16, No. 2, pp. 221-225 (2006).
Bos, Francis, "Optimization of spectral coverage in an eight-cell oscillator-amplifier dye laser pumped at 308 nm." Applied Optics, vol. 20, No. 20, pp. 3553-3556 (1981).

Casida, Mark E. et al., "Molecular excitation energies to high-lying bound states from time-dependent density-functional response theory: Characterization and correction of the time-dependent local density approximation ionization threshold." Journal of Chemical Physics, vol. 108, No. 11, pp. 4439-4449 (1998).
Chatten, A. J. et al., "A new approach to modelling quantum dot concentrators." Solar Energy Materials and Solar Cells, vol. 75, No. 3-4, pp. 363-371 (2003).
Chen, Chun-Chao et al., "Visibly Transparent Polymer Solar Cells Produced by Solution Processing." ACS Nano, vol. 6, No. 8, pp. 7185-7190 (2012).
Currie, Michael J. et al., "High-Efficiency Organic Solar Concentrators for Photovoltaics." Science, vol. 321, No. 5886, pp. 226-228 (2008).
Debije, Michael G. et al., "Thirty Years of Luminescent Solar Concentrator Research: Solar Energy for the Built Environment." Advanced Energy Materials, vol. 2, pp. 12-35 (2012).
Decker, C. David, "Excited state absorption and laser emission from infrared laser dyes optically pumped at 532 nm." Applied Physics Letters, vol. 27, No. 11, pp. 607-609 (1975).
Dunning Jr., Thom H., "Gaussian basis sets for use in correlated molecular calculations. I. The atoms boron through neon and hydrogen." Jounral of Chemical Physics, vol. 90, No. 2, pp. 1007-1023 (1989).
Escobedo, Jorge O. et al., "NIR dyes for bioimaging applications." Current Opinion in Chemical Biology, vol. 14, pp. 64-70 (2010).
Exciton, "LDS 730." www.exciton.com/pdfs/lds730.pdf.
Fischer, Georg M. et al., "Pyrrolopyrrole Cyanine Dyes: A New Class of Near-Infrared Dyes and Fluorophores." Chemistry—A European Journal, vol. 15, No. 19, pp. 4857-4864 (2009).
Galluzzi, F. et al., "Spectrum shifting of sunlight by luminescent sheets: Performance evaluation of photovoltaic applications." Solar Energy, vol. 33, No. 6, pp. 501-507 (1984).
Gao, Dangli et al., "Codopant ion-induced tunable upconversion emission in $\beta$-NaYF$_4$:Yb$^{3+}$/Tm$^{3+}$nanorods." Dalton Transactions, vol. 42, No. 5, pp. 1834-1841 (2013).
Goetzberger, A. et al., "Solar Energy Conversion with Fluorescent Collectors." Applied Physics, vol. 14, pp. 123-139 (1977).
Goldschmidt, Jan Christoph et al., "Increasing the efficiency of fluorescent concentrator systems." Solar Energy Materials and Solar Cells, vol. 93, No. 2, pp. 176-182 (2009).
Gross, E. K. U. et al., "Local Density-Functional Theory of Frequency-Dependent Linear Response." Physical Review Letters, vol. 55, No. 26, pp. 2850-2852 (1985).
Hirata, So et al., "Time-dependent density functional theory within the Tamm-Dancoff approximation." Chemical Physics Letters, vol. 314, No. 3-4, pp. 291-299 (1999).
Iles, P.A., "Non-solar photovoltaic cells." Proceedings of the 21st IEEE Conference on Photovoltaic Specialists, vol. 1, pp. 420-425 (1990).
Jacquemin, Denis et al., "Assessment of the efficiency of long-range corrected functionals for some properties of large compounds." Journal of Chemical Physics, vol. 126, No. 14, pp. 144105-1-144105-12 (2007).
Knorr, Fritz J. et al., "Investigation of Solvent Isotope Effects on Raman and Fluorescence Intensity of LDS750 in CH$_3$OH and CD$_3$OD." Journal of Physical Chemistry A, vol. 104, No. 42, pp. 9494-9499 (2000).
Kohn, W. et al., "Self-Consistent Equations Including Exchange and Correlation Effects." Physical Review, vol. 140, No. 4A, pp. A1133-A1138 (1965).
Kowalski, Karol et al., "New coupled-cluster methods with singles, doubles, and noniterative triples for high accuracy calculations of excited electronic states." Journal of Chemical Physics, vol. 120, No. 4, pp. 1715-1738 (2004).
Lunt, Richard R. et al., "Transparent, near-infrared organic photovoltaic solar cells for window and energy-scavenging applications." Applied Physics Letters, vol. 98, No. 11, pp. 113305-1-113305-3 (2011).
Lunt, Richard R., "Theoretical limits for visibly transparent photovoltaics." Applied Physics Letters, vol. 101, No. 4, pp. 043902-1-043902-4 (2012).
Martin, Richard L., "Natural transition orbitals." Journal of Chemical Physics, vol. 118, No. 11, pp. 4775-4777 (2003).

(56) References Cited

OTHER PUBLICATIONS

Moore, C. A. et al., "Power-scaling effects in dye lasers under high-power laser excitation." Journal of Applied Physics, vol. 49, No. 1, pp. 47-60 (1978).
Ostrowski, Jacek C. et al., "Near-Infrared Electroluminescent Light-Emitting Devices Based on Ethyne-Bridged Porphyrin Fluorophores." Advanced Materials, vol. 15, No. 15, pp. 1296-1300 (2003).
Pansare, Vikram J. et al., "Review of Long-Wavelength Optical and NIR Imaging Materials: Contrast Agents, Fluorophores, and Multifunctional Nano Carriers." Chemistry of Materials, vol. 24, No. 5, pp. 812-827 (2012).
Peng, Xiaojun et al., "Heptamethine Cyanine Dyes with a Large Stokes Shift and Strong Fluorescence: A Paradigm for Excited-State Intramolecular Charge Transfer." Journal of the American Chemical Society, vol. 127, No. 12, pp. 4170-4171 (2005).
Philip, R. et al., "Absorption and fluorescence spectroscopic investigation of indocyanine green." Journal of Photochemistry and Photobiology A: Chemistry, vol. 96, No. 1-3, pp. 137-148 (1996).
Piecuch, Piotr et al., "Efficient computer implementation of the renormalized coupled-cluster methods: The R-CCSD[T], R-CCSD(T), CR-CCSD[T], and CR-CCSD(T) approaches." Computer Physics Communications, vol. 149, No. 2, pp. 71-96 (2002).
Qian, Chao et al., "Synthesis and Downconversion Emission Property of $Yb_2O_3$:$Eu^{3+}$Nanosheets and Nanotubes." Advances in Condensed Matter Physics, vol. 2013, No. 519869, pp. 1-5 (2013).
Reigue, Antoine et al., "CW measurements of resonance Raman profiles, line-widths, and cross-sections of fluorescent dyes: application to Nile Blue A in water and ethanol." Journal of Raman Spectroscopy, vol. 44, No. 4, pp. 573-581 (2013).
Rowan, Brenda C. et al., "Advanced Material Concepts for Luminescent Solar Concentrators." IEEE Journal of Selected Topics in Quantum Electronics, vol. 14, No. 5, pp. 1312-1322 (2008).
Rurack, Knut et al., "Fluorescence Quantum Yields of a Series of Red and Near-Infrared Dyes Emitting at 600-1000 nm." Analytical Chemistry, vol. 83, No. 4, pp. 1232-1242 (2011).
Schmidt, Michael W. et al., "General atomic and molecular electronic structure system." Journal of Computational Chemistry, vol. 14, No. 11, pp. 1347-1363 (1993).
Shao, Yihan et al., "Advances in methods and algorithms in a modern quantum chemistry program package." Physical Chemistry Chemical Physics, vol. 8, No. 27, pp. 3172-3191 (2006).
Shcherbatyuk, G. V. et al., "Viability of using near infrared PbS quantum dots as active materials in luminescent solar concentrators." Applied Physics Letters, vol. 96, No. 19, pp. 191901-1-191901-3 (2010).
Sheng, Xing et al., "Doubling the Power Output of Bifacial Thin-Film GaAs Solar Cells by Embedding Them in Luminescent Waveguides." Advanced Energy Materials, vol. 3, No. 8, pp. 991-996 (2013).
Sholin, V. et al., "Semiconducting polymers and quantum dots in luminescent solar concentrators for solar energy harvesting." Journal of Applied Physics, vol. 101, No. 12, pp. 123114-1-123114-9 (2007).
Shrotriya, Vishal et al., "Accurate Measurement and Characterization of Organic Solar Cells." Advanced Functional Materials, vol. 16, No. 15, pp. 2016-2023 (2006).
Smestad, G. et al., "The thermodynamic limits of light concentrators." Solar Energy Materials, vol. 21, No. 2-3, pp. 99-111 (1990).
Soni, Abhishek Kumar et al., "Host-Sensitized Continuum-Broad-Band White-Light Emitting $Yb_2O_3$:$Er^{3+}$Phosphor under CW-NIR Light Absorption." ChemistrySelect, vol. 4, No. 12, pp. 3408-3415 (2019).
Stanton, John F. et al., "The equation of motion coupled-cluster method. A systematic biorthogonal approach to molecular excitation energies, transition probabilities, and excited state properties." Journal of Chemical Physics, vol. 98, No. 9, pp. 7029-7039 (1993).
van Sark, Wilfried G.J.H.M. et al., "Luminescent Solar Concentrators - A review of recent results." vol. 16, No. 26, pp. 21773-21792 (2008).
Wang, Tongxin et al., "Luminescent solar concentrator employing rare earth complex with zero self-absorption loss." Solar Energy, vol. 85, No. 11, pp. 2571-2579 (2011).
Weber, W. H. et al., "Luminescent greenhouse collector for solar radiation." Applied Optics, vol. 15, No. 10, pp. 2299-2300 (1976).
Weissleder, Ralph, "A clearer vision for in vivo imaging." Nature Biotechnology, vol. 19, No. 4, pp. 316-317 (2001).
Werts, Martinus H.V. et al., "Fluorescein and eosin as sensitizing chromophores in near-infrared luminescent ytterbium(III), neodymium(III) and erbium(III) chelates." Chemical Physics Letters, vol. 276, No. 3-4, pp. 196-201 (1997).
Wittwer, V. et al., "Fluorescent planar concentrators." Solar Energy Materials, vol. 11, No. 3, pp. 187-197 (1984).
Wloch, Marta et al., "Extension of renormalized coupled-cluster methods including triple excitations to excited electronic states of open-shell molecules." Journal of Chemical Physics, vol. 122, No. 21, pp. 214107-1-214107-15 (2005).
Yanai, Takeshi et al., "A new hybrid exchange-correlation functional using the Coulomb-attenuating method (CAM-B3LYP)." Chemical Physics Letters, vol. 393, No. 1-3, pp. 51-57 (2004).
Yoon, Jongseung et al., "Flexible concentrator photovoltaics based on microscale silicon solar cells embedded in luminescent waveguides." Nature Communications, vol. 2, No. 343, pp. 1-8 (2011).
Zhao, Yimu et al., "Transparent Luminescent Solar Concentrators for Large-Area Solar Windows Enabled by Massive Stokes-Shift Nanocluster Phosphors." Advanced Energy Materials, vol. 3, No. 9, pp. 1143-1148 (2013).
Office Action regarding Japanese Patent Application No. 2020-003658, dated Jun. 29, 2021, Translation provided by Harakenzo World Patent and Trademark.
Wurth, Christian, et al. "Integrating sphere setup for the traceable measurement of absolute photoluminescence quantum yields in the near infrared." Analytical chemistry 84.3 (2012): 1345-1352.
Office Action regarding Japanese Patent Application No. 2020-003658, dated Nov. 2, 2021. Translation provided by Harakenzo World Patent and Trademark.
Office Action for South Korean Application No. 1020167028918 dated Dec. 3, 2021, with English language translation.
Office Action for Japanese Application 2022114145 dated Apr. 18, 2023, with English language translation.
Office Action regarding Japanese Application 2020003658 dated Jun. 27, 2023, with English language translation.
Office Action for corresponding Chinese Application 201980069470.4 dated Mar. 20, 2024, with English comments.
Office Action for Japanese Application 2022114145 dated Jan. 30, 2024, with English summary.
European Office Action for EP Application 19866428.6 dated Feb. 17, 2025.
Notice of Allowance for U.S. Appl. No. 18/196,766 dated Jan. 28, 2025.
Office Action for U.S. Appl. No. 18/196,766 dated Oct. 2, 2024.

* cited by examiner

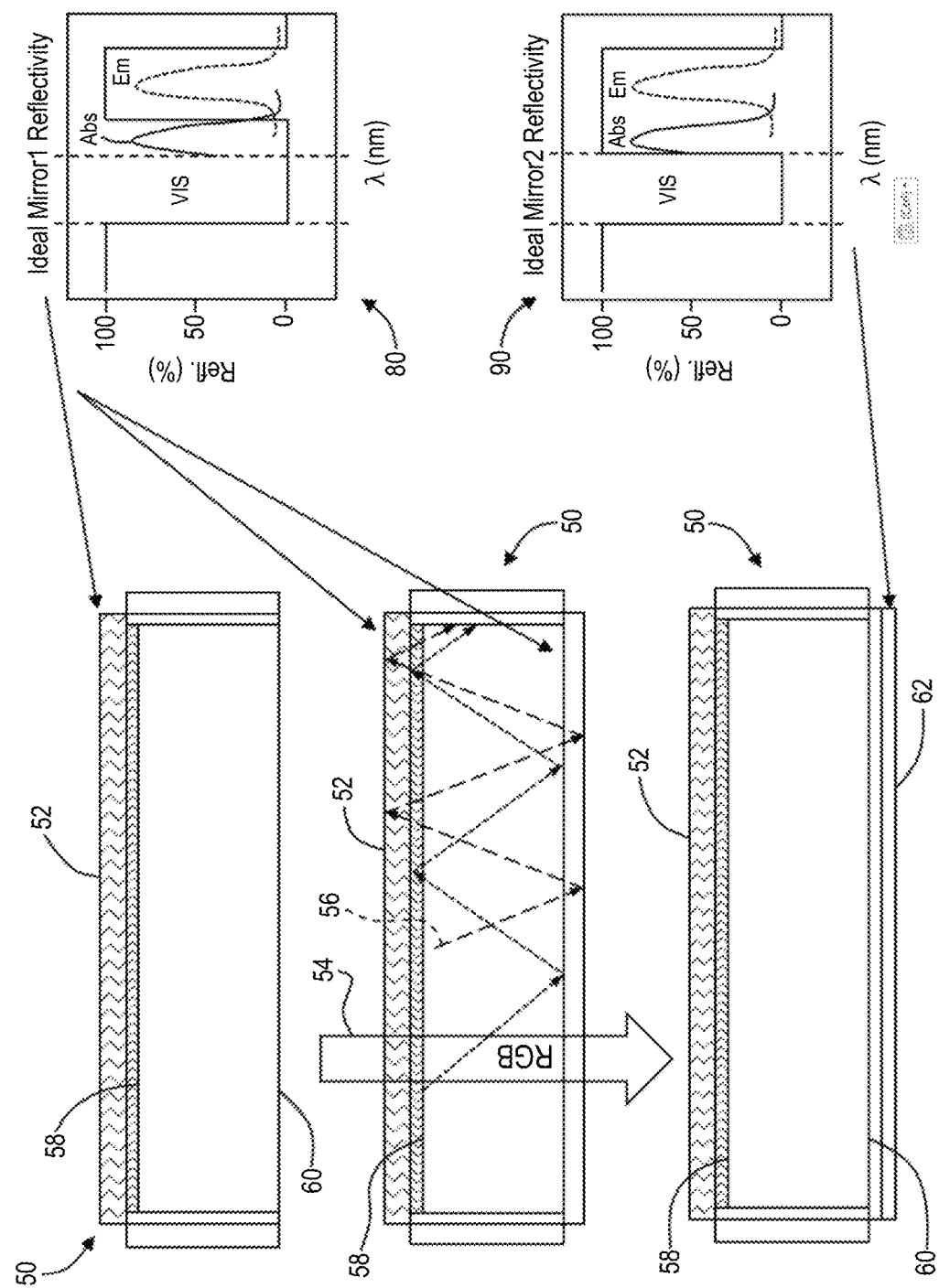

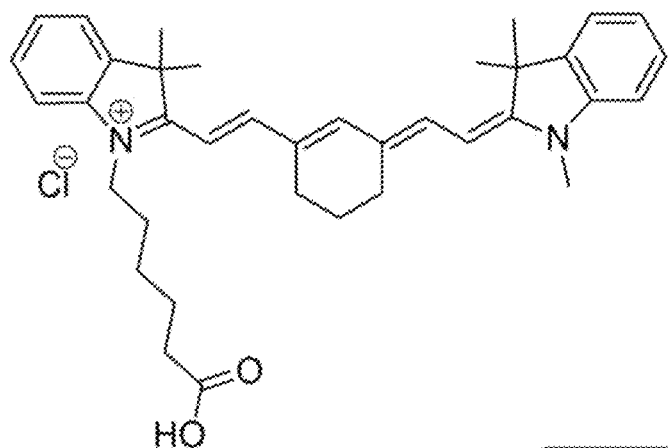
Fig. 7A
Fig. 7B
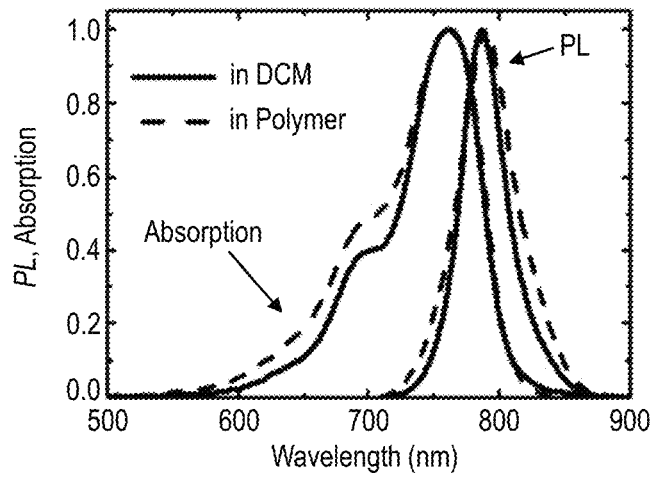
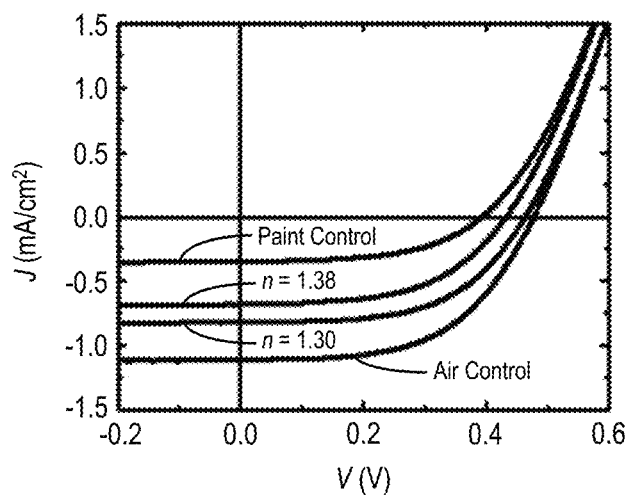
Fig. 7C

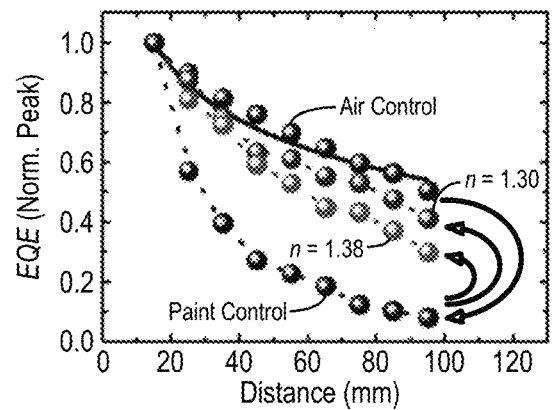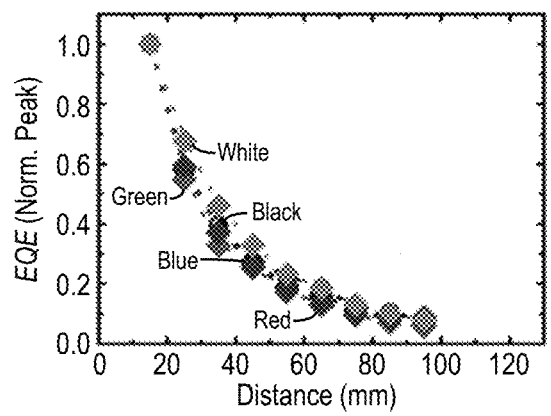
Fig. 9A  Fig. 9B
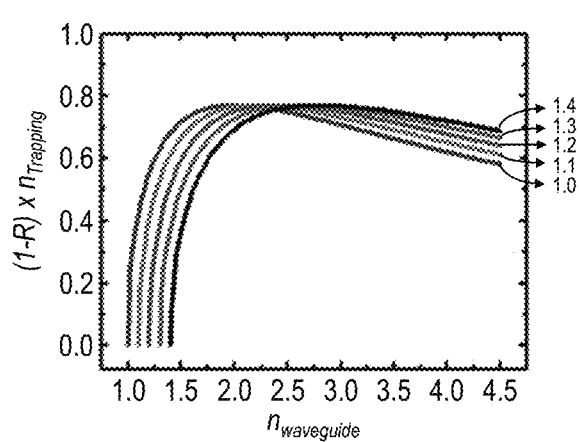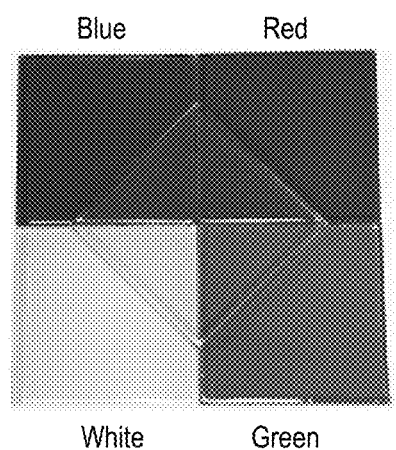
Fig. 9C  Fig. 9D

TRANSPARENT LUMINESCENT SOLAR CONCENTRATOR

CROSS-REFERENCE TO RELATED APPLICATIONS

This application is a 371 U.S. National Phase of International Application No. PCT/US2019/052436, filed Sep. 23, 2019, which claims the benefit of U.S. Provisional Application No. 62/735,433, filed on Sep. 24, 2018. The entire disclosures of the above applications are incorporated herein by reference.

GOVERNMENT RIGHTS

This invention was made with government support under 1702591 awarded by the National Science Foundation. The government has certain rights in the invention.

FIELD

The present disclosure relates to a transparent luminescent solar concentrator.

BACKGROUND

This section provides background information related to the present disclosure which is not necessarily prior art.

Seamless installation of solar harvesting systems onto areas provides a practical approach to utilize renewable solar energy more efficiently over currently existing surfaces. Transparent luminescent solar concentrators (transparent LSCs or TLSCs) are one example of a technology that has been designed to exploit surfaces for solar harvesting that can offer high defect tolerance, mechanical flexibility, angle independence, and low cost. TLSCs are designed to selectively harvest the invisible portion of the incident solar flux (ultraviolet (UV) or near-infrared (NIR)) and allow visible light to pass through, which minimizes the visual impact and enables the adoption in areas previously inaccessible. Thus, TLSCs are a promising candidate to supply the energy demand of currently existing surfaces on-site.

Various luminophores have been applied to luminescent solar concentrators (transparent and opaque), including quantum dots, rare-earth ions, nanoclusters, and organic molecules. Most of these applications focus on the improvement of quantum yield (QY) and the modulation of the absorption and emission spectra of the luminophores to increase the Stokes shift or to match the absorption peak of the luminophore with the peak of the incident solar spectrum, with the aim to enhance the photovoltaic performance of the LSC device, as well as the scalability. A TLSC system operates by absorbing the invisible portion of the solar spectrum by luminophores embedded in a transparent waveguide. That absorbed solar energy is then re-emitted within the waveguide at an invisible (i.e. infrared) wavelength. Due to the difference of refractive index between the waveguide and the ambient environment, the re-emitted photons are predominantly trapped within the waveguide by total internal reflection (TIR), causing them to be directed towards the waveguide edges, where these re-emitted photons can be converted into electrical power in photovoltaic cells. According to Snell's law, the key to ensuring TIR is that the waveguide is made of a material with higher index of refraction (n) value than that of both the front and back claddings. The waveguide material should also have low extinction coefficient (k) or scattering coefficient at the wavelength range of the photoluminescence. For example, when the windshield glass of a car ($n_{glass} \cong 1.50$) is in contact with air ($n_{air}=1.0$), both sides can function effectively as a waveguide for TLSCs. However, when a TLSC is integrated onto arbitrary surfaces, such as the siding of a car, the back of the waveguide is no longer in contact with air, but seamlessly adhered with the solid surface beneath. This results in re-emitted photons entering the back surface and being lost to absorption or scattering from that surface. Spacing an air gap between the waveguide and the surface underneath can regain this waveguide function; however, air gaps generally lack structural stability, rendering them unsuitable for robust applications.

Accordingly, there remains a need to develop methods for integrating luminescent solar concentrators onto arbitrary surfaces.

SUMMARY

This section provides a general summary of the disclosure, and is not a comprehensive disclosure of its full scope or all of its features.

In various aspects, the current technology provides a solar concentrator device having a waveguide including a luminophore and having a first refractive index; a photovoltaic component operably coupled to the waveguide; and a film disposed onto a surface of the waveguide, wherein the film has a second refractive index that is lower than the first refractive index of the waveguide, and wherein the waveguide and the film are visibly transparent.

In one aspect, the solar concentrator device has a color rendering index of greater than or equal to about 80.

In one aspect, the second refractive index is greater than or equal to about 1.05 to less than or equal to about 1.45.

In one aspect, the second refractive index is lower than the first refractive index by greater than or equal to about 0.1.

In one aspect, the first refractive index is greater than or equal to about 1.45 to less than or equal to about 2.5.

In one aspect, the solar concentrator device is flexible.

In one aspect, the photovoltaic component is a photovoltaic array that is either disposed onto a surface of the waveguide or embedded within the waveguide.

In one aspect, the luminophore is either embedded within the waveguide or disposed onto a surface of the waveguide.

In one aspect, the film has a tensile strength of greater than or equal to about 0.05 MPa.

In one aspect, the film has a Young's modulus of less than or equal to about 10 MPa.

In one aspect, the film has a Shore hardness of greater than or equal to about 40 D or a pencil hardness of greater than or equal to about 1H.

In one aspect, the film has a thickness of greater than or equal to about 0.1 µm to less than or equal to about 1 mm.

In one aspect, the film includes an oxide, a metal oxide, a ceramic, a glass, a polymer, or a combination thereof.

In one aspect, the film includes poly(1,1,1,3,3,3-hexafluoroisopropyl acrylate), poly(2,2,3,3,4,4,4-heptafluorobutyl acrylate), poly(2,2,3,3,4,4,4-heptafluorobutyl methacrylate), poly(2,2,3,3,3-pentafluoropropyl acrylate), poly(1,1,1,3,3,3-hexafluoroisopropyl methacrylate), poly(2,2,3,4,4,4-hexafluorobutyl acrylate), poly(2,2,3,4,4,4-hexafluorobutyl methacrylate), poly(2,2,3,3,3-pentafluoropropyl methacrylate), poly(2,2,2-trifluoroethyl acrylate), poly(2,2,3,3-tetrafluoropropyl acrylate), poly(2,2,3,3-tetrafluoropropyl methacrylate), poly(2,2,2-trifluoroethyl methacrylate), $SiO_2$, SiOF, $MgF_2$, $CaF_2$, nanoporous $SiO_2$, nanoporous $MgF_2$, nanoporous ITO, nanoporous $CaF_2$, or a combination thereof.

In one aspect, the film is an adhesive.

In one aspect, the film has an adhesive surface opposite to a surface of the film that is disposed onto the surface of the waveguide.

In one aspect, the solar concentrator device further includes a sheet disposed onto the adhesive surface, wherein the sheet is configured to be peeled off of the solar concentrator device to expose the adhesive surface of the film.

In one aspect, the solar concentrator device is disposed onto a substrate with the film located between the substrate and the waveguide.

In one aspect, color coordinates of the substrate with the solar concentrator device are within about 50% of the color coordinates of the substrate alone.

In one aspect, the substrate is a surface of a vehicle, a billboard, a surface of a building, a mobile electronic device, or a surface of a greenhouse.

In one aspect, the substrate is the surface of the vehicle, the surface of the vehicle being curved.

In one aspect, the solar concentrator device further includes a top coat disposed onto an exposed surface of the waveguide, wherein the top coat is transparent to visible and infrared light.

In one aspect, the solar concentrator device further includes an adhesive layer disposed onto the film, wherein the film is located between the adhesive layer and the waveguide.

In one aspect, the waveguide has a refractive index of greater than or equal to about 1.45 to less than or equal to about 2.5.

In one aspect, the solar concentrator device further includes a second solar concentrator device disposed onto the solar concentrator device, the second solar concentrator device having a second waveguide including a second luminophore, a second photovoltaic component operably coupled to the second waveguide, and a second film having a refractive index of greater than or equal to about 1.05 to less than or equal to about 1.45, the second waveguide, the second photovoltaic component, and the second film both being visibly transparent, wherein the second film is positioned between the solar concentrator device and the second solar concentrator device.

In one aspect, the solar concentrator device further includes a stack having a plurality of additional solar concentrator devices disposed onto the solar concentrator device on a surface opposite to the film, wherein each of the plurality of additional solar concentrator devices includes an additional waveguide having an additional luminophore, an additional photovoltaic component operably coupled to the additional waveguide, and an additional film having a refractive index of greater than or equal to about 1.05 to less than or equal to about 1.45, each of the additional waveguide, the additional photovoltaic component, and the additional film being visibly transparent, and wherein no additional film is directly disposed onto another additional film.

In one aspect, the plurality of additional solar concentrator devices of the stack includes greater than or equal to 2 additional solar concentrator devices to less than or equal to 10 additional solar concentrator devices.

In various aspects, the current technology further provides a solar concentrator device having a visibly transparent luminescent solar concentrator (TLSC) including a waveguide having a first refractive index; and a visibly transparent film disposed onto a surface of the TLSC, the film having an adhesive surface that is not disposed onto the surface of the TLSC and having a second refractive index, wherein the second refractive index is lower than the first refractive index.

In one aspect, the TLSC includes luminophores that have a maximum peak absorbance in the UV, NIR, or IR and a maximum peak emission in the NIR or IR.

In one aspect, the TLSC includes a photovoltaic cell or a photovoltaic array.

In one aspect, the film includes poly(1,1,1,3,3,3-hexafluoroisopropyl acrylate), poly(2,2,3,3,4,4,4-heptafluorobutyl acrylate), poly(2,2,3,3,4,4,4-heptafluorobutyl methacrylate), poly(2,2,3,3,3-pentafluoropropyl acrylate), poly(1,1,1,3,3,3-hexafluoroisopropyl methacrylate), poly(2,2,3,4,4,4-hexafluorobutyl acrylate), poly(2,2,3,4,4,4-hexafluorobutyl methacrylate), poly(2,2,3,3,3-pentafluoropropyl methacrylate), poly(2,2,2-trifluoroethyl acrylate), poly(2,2,3,3-tetrafluoropropyl acrylate), poly(2,2,3,3-tetrafluoropropyl methacrylate), poly(2,2,2-trifluoroethyl methacrylate), $SiO_2$, SiOF, $MgF_2$, $CaF_2$, nanoporous $SiO_2$, nanoporous $MgF_2$, nanoporous ITO, nanoporous $CaF_2$, or a combination thereof.

In various aspects, the current technology also provides a method of fabricating a solar concentrator device, including obtaining a solar concentrator including a waveguide having a luminophore and having a first refractive index, and a photovoltaic component operably coupled to the waveguide; and disposing a film onto a surface of the solar concentrator, wherein the film has a second refractive index that is lower than the first refractive index of the waveguide, wherein the waveguide and the film are visibly transparent.

In one aspect, the disposing the film onto the surface of the solar concentrator includes depositing the film onto the surface of the solar concentrator by glancing angle deposition.

In one aspect, the disposing the film onto the surface of the solar concentrator includes depositing the film onto the surface of the solar concentrator by solution deposition.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 2A:
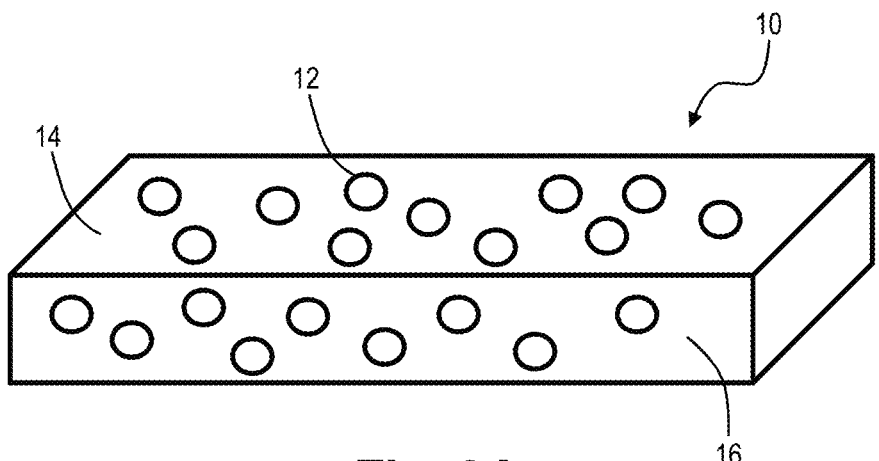
FIG. 2A is a schematic illustration of a waveguide comprising luminophores in accordance with various aspects of the current technology.
Figure 2B:
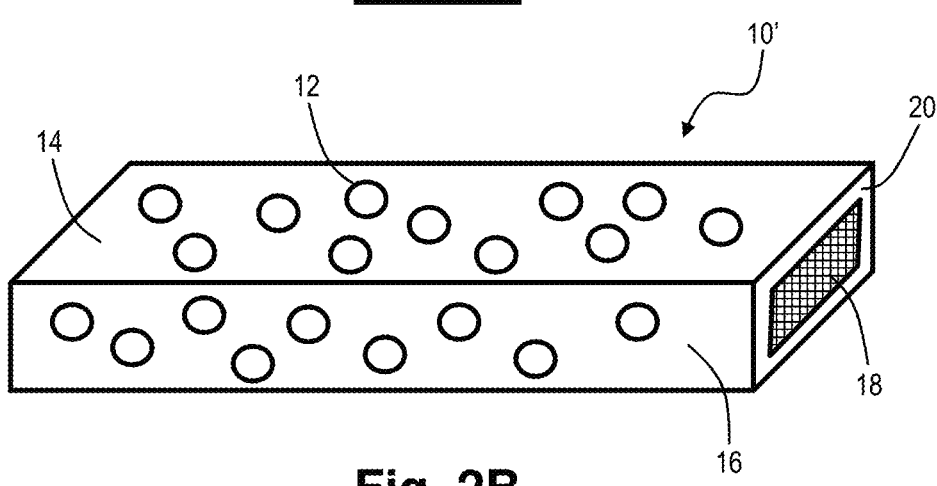
FIG. 2B is a schematic illustration of a waveguide comprising luminophores. A photovoltaic cell is disposed onto an edge of the waveguide, where the edge can be rectangular, curved, or beveled in accordance with various aspects of the current technology.
Figure 2C:
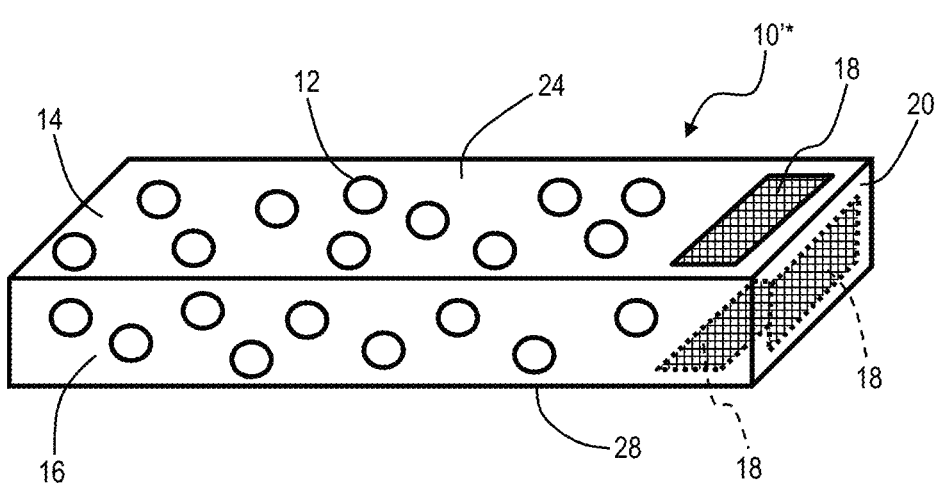

FIG. 2C is a schematic illustration of a waveguide comprising luminophores. A photovoltaic cell is disposed onto a surface of the waveguide. Optional additional photovoltaic cells are disposed onto at least one of a second surface of the waveguide and an edge of the waveguide in accordance with various aspects of the current technology.

Figure 2D:
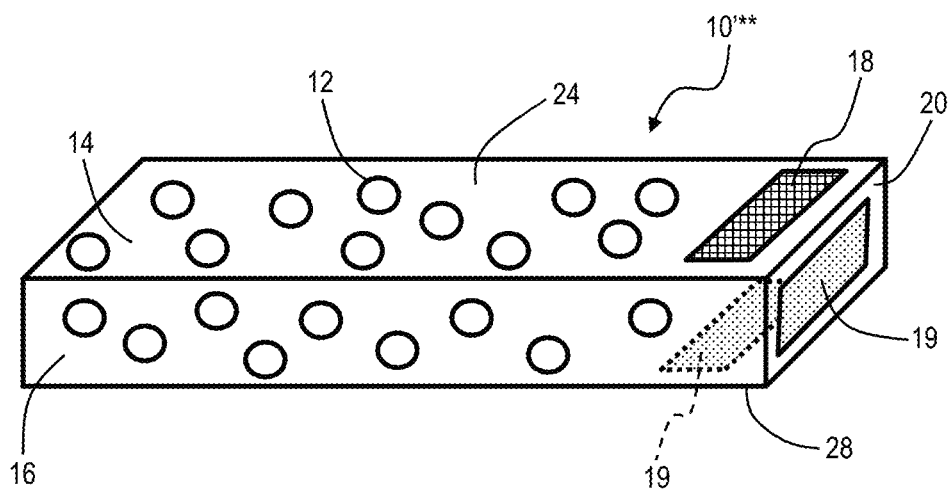

FIG. 2D is a schematic illustration of a waveguide comprising luminophores. A photovoltaic cell is disposed onto a first surface of the waveguide and a wavelength-specific mirror is disposed onto an edge of the waveguide. An optional wavelength-dependent mirror is disposed onto a second surface of the waveguide in accordance with various aspects of the current technology.

Figure 2E:
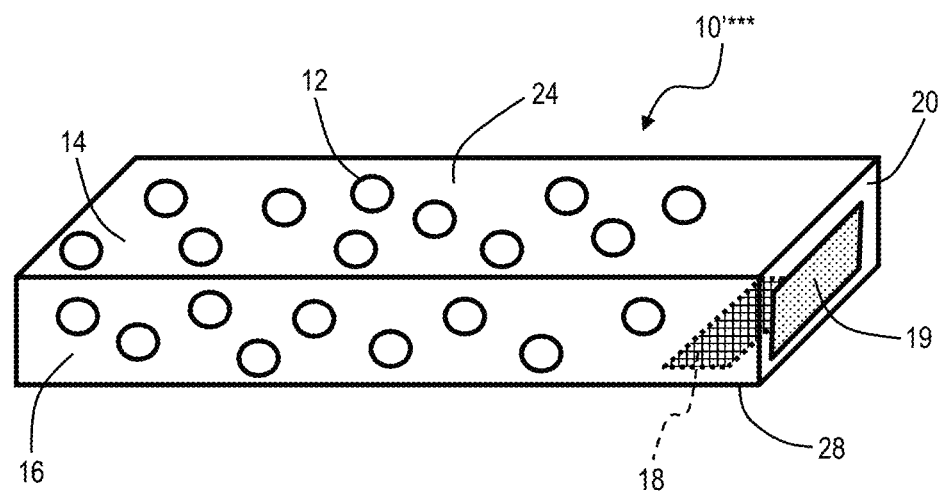

FIG. 2E schematic illustration of a waveguide comprising luminophores. A photovoltaic cell is disposed onto a first surface of the waveguide and a wavelength-specific mirror is disposed onto an edge of the waveguide in accordance with various aspects of the current technology.

Figure 2F:
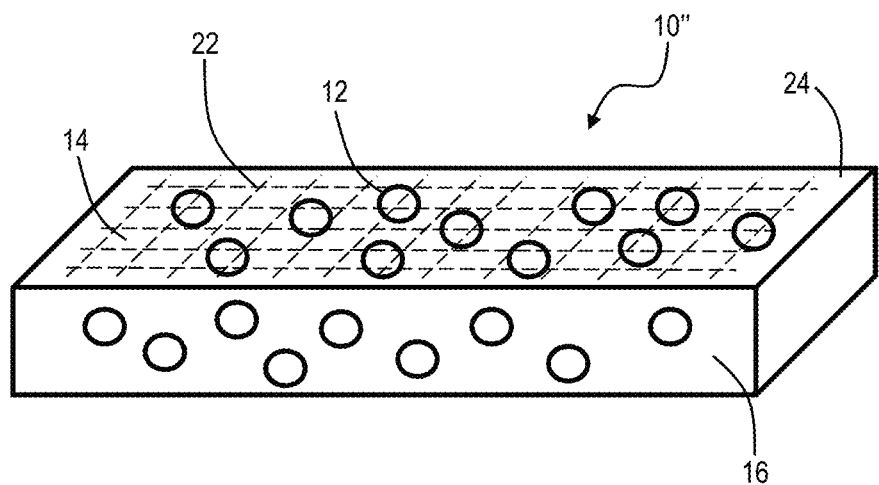

FIG. 2F is a schematic illustration of a waveguide comprising luminophores. A photovoltaic array is disposed at or near a surface of the waveguide in accordance with various aspects of the current technology.

Figure 2G:
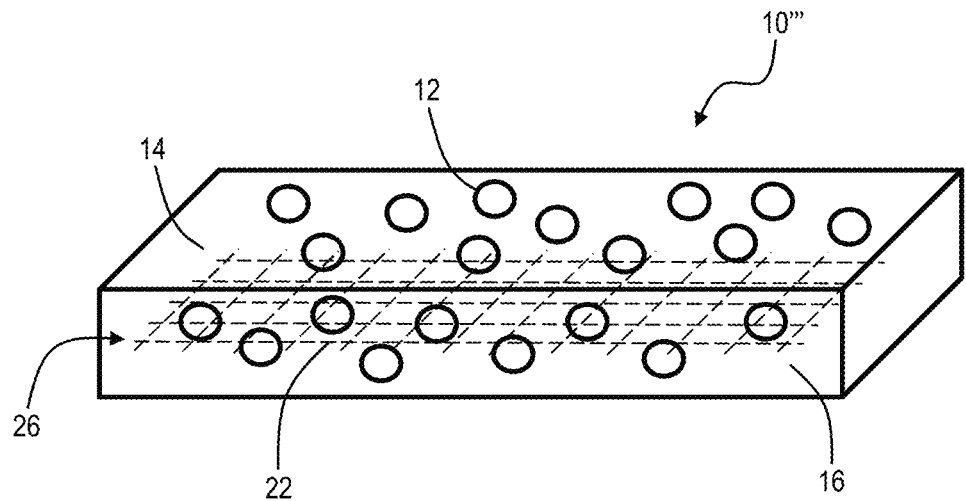

FIG. 2G is a schematic illustration of a waveguide comprising luminophores. A photovoltaic array is embedded within the waveguide in accordance with various aspects of the current technology.

FIG. 3 is a schematic illustration of an exemplary luminescent solar concentrator having a wavelength-dependent mirror according to various aspects of the current technology.

Figure 4:
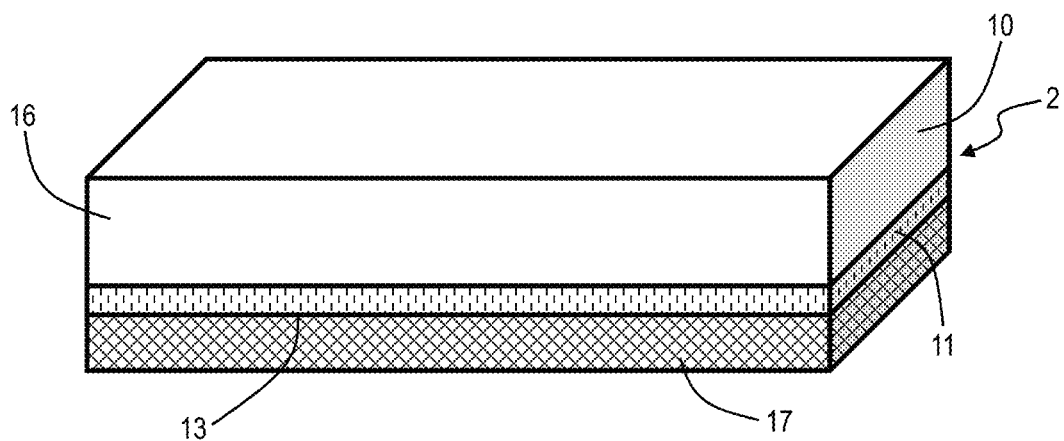

FIG. 4 is a schematic illustration of a solar concentrator device disposed onto a substrate in accordance with various aspects of the current technology.

Figure 5A:
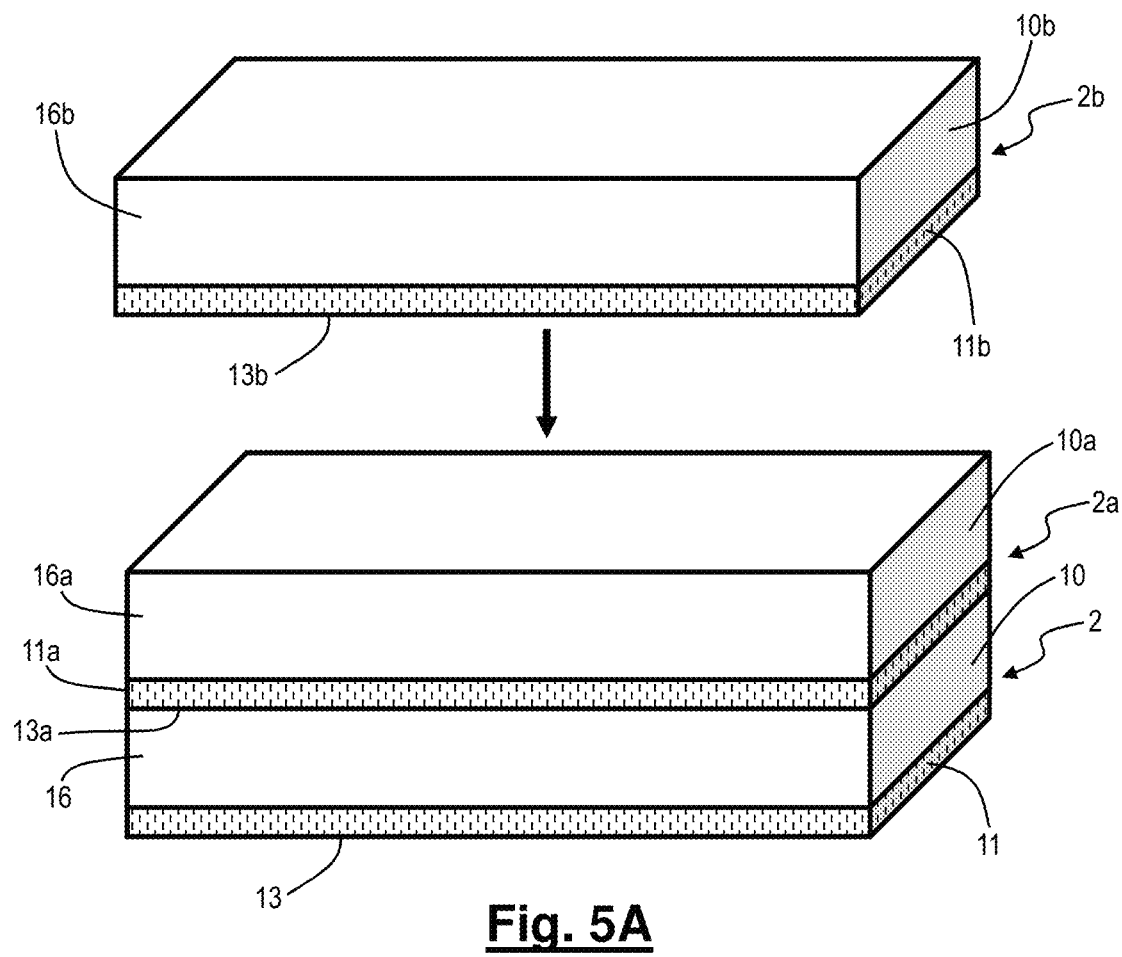

FIG. 5A is a schematic illustration of solar concentrator devices stacked upon each other in accordance with various aspects of the current technology.

Figure 5B:
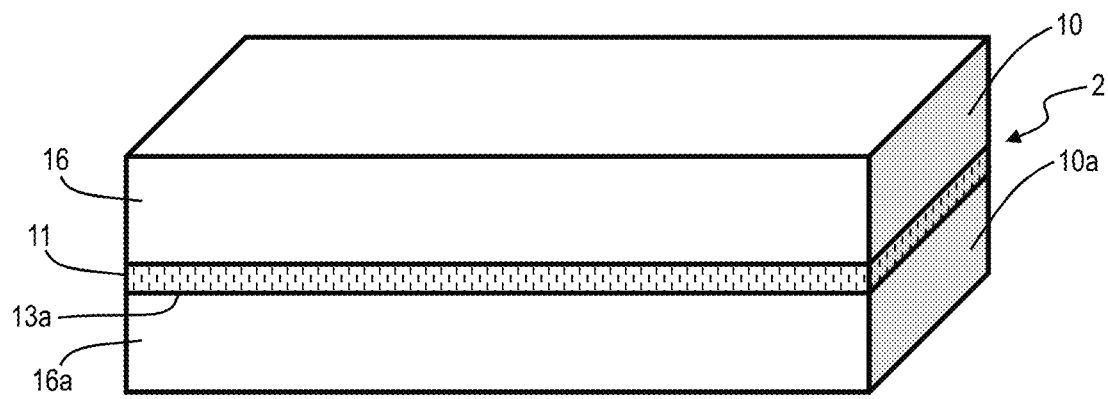

FIG. 5B is a schematic illustration of a stack of solar concentrators that does not include an exposed adhesive film in accordance with various aspects of the current technology.

Figure 6:
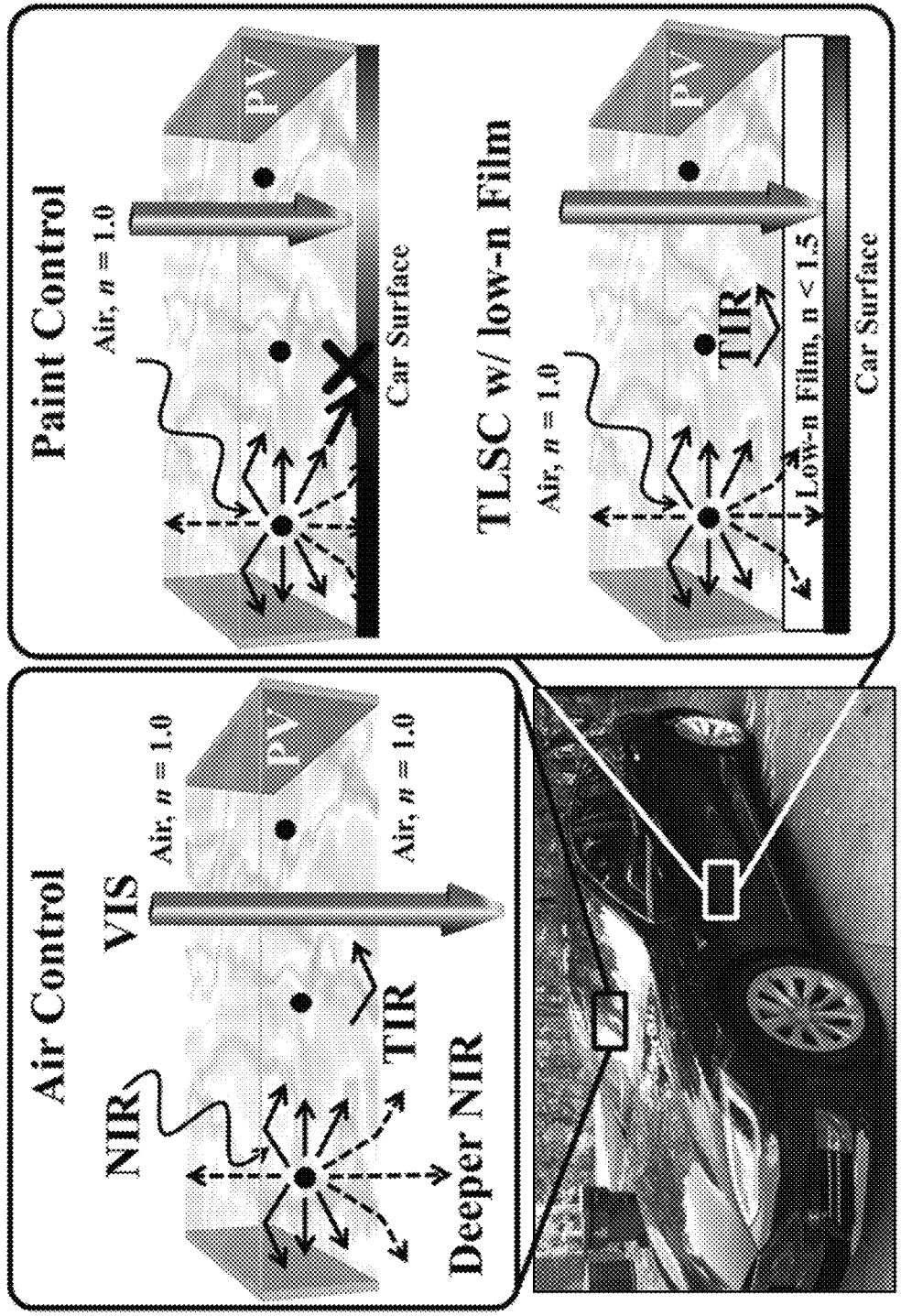

FIG. 6 is a conceptual schematic illustration showing an exemplary near-infrared (NIR) harvesting transparent luminescent solar concentrator (TLSC) integrated onto the window ("Air Control") and non-window ("TLSC w/Low-n Film") parts of an automobile. The TLSC without low-n film cannot function due to the disabling of total internal reflection (TIR), which is also included in the schematic as "Paint Control."

FIG. 7A shows the molecular structure of Cy7-CA.

FIG. 7B shows the normalized absorption and emission spectra of Cy7-CA in DCM solution (solid lines) and polymer matrix film (dashed lines).

FIG. 7C shows current density as a function of voltage (J-V curves) for exemplary fully assembled TLSC systems with different exemplary layer structures including "Air Control," "n=1.30," "n=1.38," and "Paint Control."

Figure 7D:
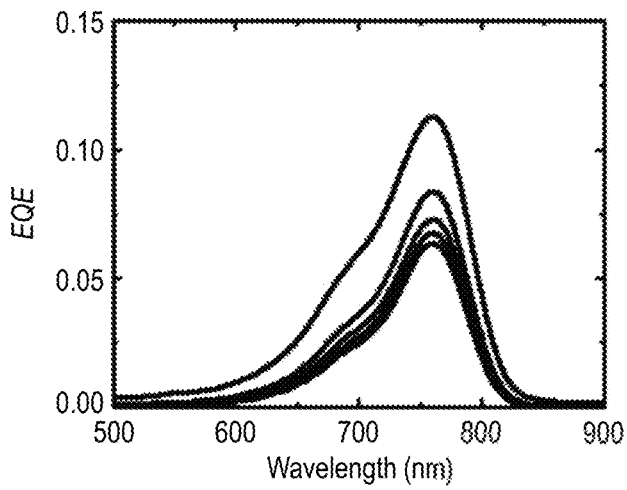

FIG. 7D shows absolute external quantum efficiency (EQE) spectra of the exemplary "Air Control" TLSC system as a function of wavelength measured at d=5 mm, 15 mm, 25 mm, 35 mm and 45 mm.

Figure 7E:
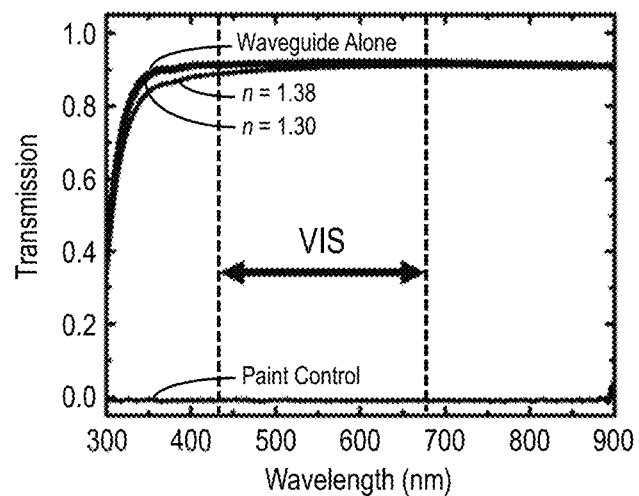

FIG. 7E shows transmission spectra for an exemplary waveguide alone, "n=1.30" film coated on the backside of the waveguide, "n=1.38" film coated on the backside of the waveguide, and paint on the backside of the waveguide. Average Visible Transmittance (AVT) and Color Rendering Index (CRI) are calculated based on these transmission spectra.

Figure 7F:
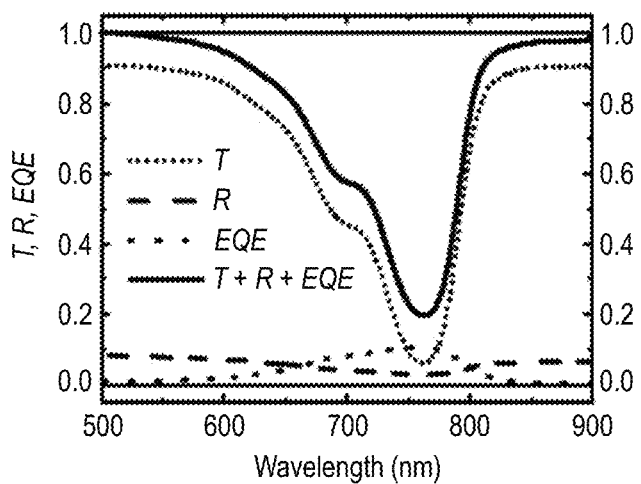

FIG. 7F shows transmission ($T(\lambda)$), reflection ($R(\lambda)$), EQE, and photon balance ($EQE(\lambda)+R(\lambda)+T(\lambda)) \leq 1$ of the exemplary "Air Control" TLSC device.

Figure 8A:
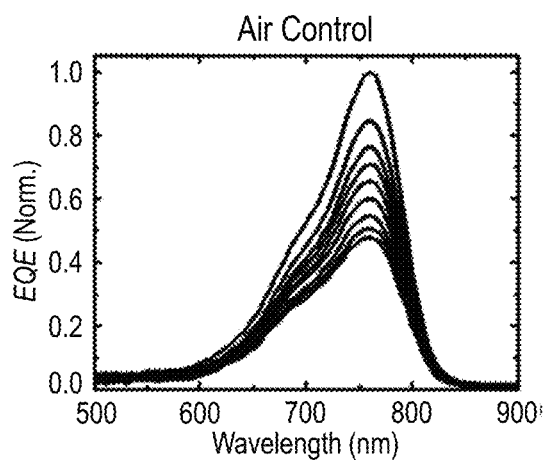

FIG. 8A shows position-dependent EQE spectra of the exemplary "Air Control" TLSC device as a function of wavelength measured from 15 mm to 95 mm, with 10 mm increments.

Figure 8B:
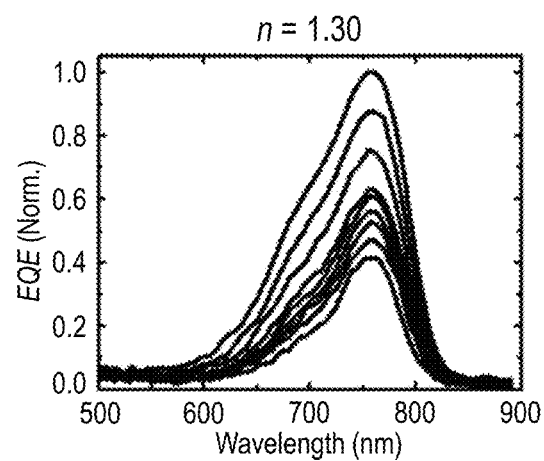

FIG. 8B shows position-dependent EQE spectra of the "n=1.30" exemplary TLSC device as a function of wavelength measured from 15 mm to 95 mm, with 10 mm increments.

Figure 8C:
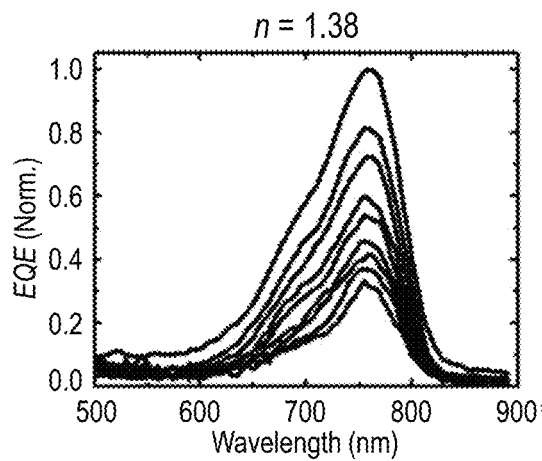

FIG. 8C shows position-dependent EQE spectra of the "n=1.38" exemplary TLSC device as a function of wavelength measured from 15 mm to 95 mm, with 10 mm increments.

Figure 8D:
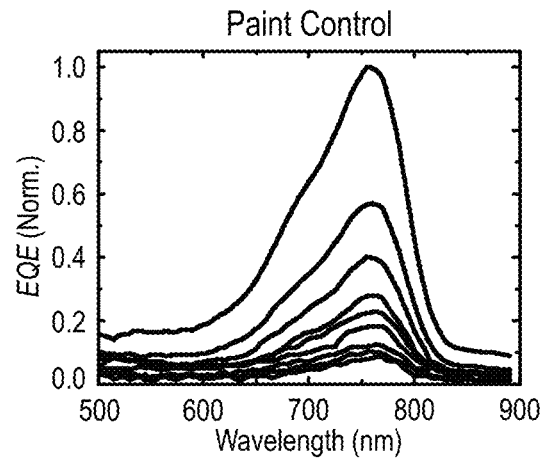

FIG. 8D shows position-dependent EQE spectra of the exemplary "Paint Control" TLSC device as a function of wavelength measured from 15 mm to 95 mm, with 10 mm increments.

FIG. 9A shows simulated optical efficiency (solid line) as a function of distance (d) to fit the measured normalized EQE peak values of the exemplary "Air Control" TLSC system. The measured normalized EQE peak values of other exemplary TLSC systems including "n=1.30," "n=1.38," and "Paint Control" are also plotted for comparison.

FIG. 9B shows the measured normalized EQE peak values of colored (black, blue, green, red, and white) exemplary "Paint Control" TLSC systems.

FIG. 9C is a graph showing the product of the reflection and trapping efficiencies (($1-R_f)\cdot\eta_{Trap}$) of simple exemplary waveguides for different $n_{cladding}$ (1.0 to 1.4) scenarios as a function of $n_{waveguide}$. In all cases, the maximum product is 0.77.

FIG. 9D is a photograph of four colored exemplary "Paint Control" TLSCs with an exemplary "Air Control" TLSC on top. The photograph shows that the dye/polymer composite layers largely do not impact the fidelity of the original aesthetic quality of the surfaces underneath.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges. As referred to herein, ranges are, unless specified otherwise, inclusive of endpoints and include disclosure of all distinct values and further divided ranges within the entire range. Thus, for example, a range of "from A to B" or "from about A to about B" is inclusive of A and B.

Example embodiments will now be described more fully with reference to the accompanying drawings.

The current technology provides solar concentrator (SC) devices, such as TLSC devices, that can be integrated onto arbitrary surfaces. The SC devices can be applied to an arbitrary surface by way of a film that is either adhesive or that includes an adhesive surface. The SC and the film are visibly transparent, such that the arbitrary surface can be seen through the SC device with minimal difference relative to the arbitrary surface without the SC device.

Figure 1A:
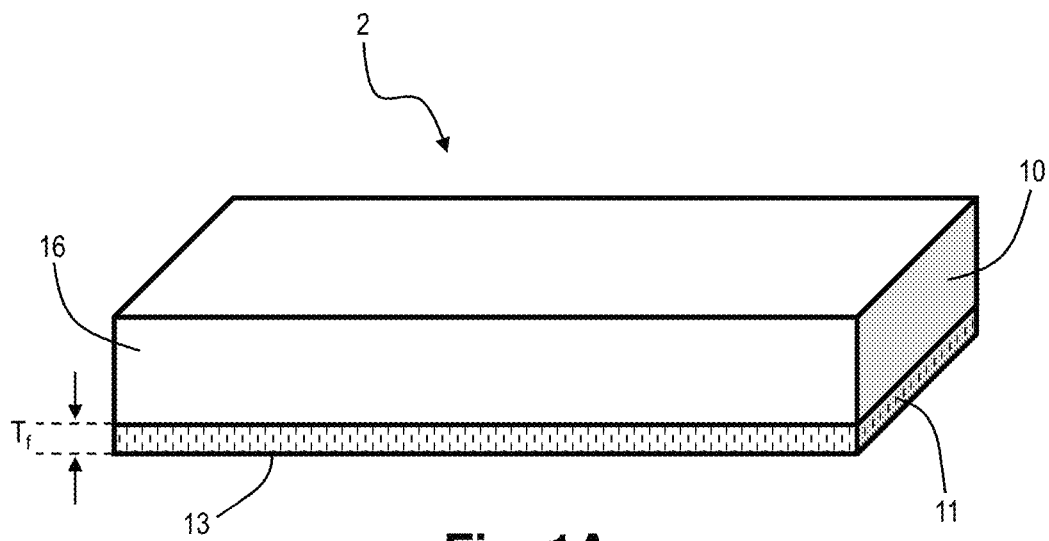
FIG. 1A is a schematic illustration of a solar concentrator device according to various aspects of the current technology.

With reference to FIG. 1A, the current technology provides a SC device 2. The SC device 2 comprises a solar concentrator 10 and a film 11 disposed onto a surface of the solar concentrator 10. The film 11 can be disposed directly onto the surface of the solar concentrator 10 or indirectly onto the surface by way of an adhesive. When the film is indirectly disposed onto the surface of the solar concentrator 10 by an adhesive, the adhesive has either a higher, equal, or lower refractive index relative to the solar concentrator 10 and is visibly transparent.

With reference to FIG. 2A, the solar concentrator 10 comprises a luminophore 12 disposed in or on a substrate 14 that defines a waveguide 16. As used herein, "luminophores" refers to inorganic or organic compounds that manifest luminescence, wherein the luminescence is fluorescence or phosphorescence. In some embodiments, the luminophore 12 is embedded within and throughout the substrate 14 and the waveguide 16. In other embodiments, the luminophore 12 is disposed onto a surface of the substrate 14 as a layer.

The luminophore 12 harvests (i.e., absorbs) light with wavelengths in at least one of the visible ("VIS"), NIR, and IR regions of the solar spectrum. As used herein, VIS light has a wavelength from about 450 nm to about 650 nm, "NIR" light has a wavelength from about 650 nm to about 1500 nm, and "IR" light has a wavelength form about 1500 nm to about 1 mm. Also, as used herein the terms "transparent" or "visibly transparent" refer to apparatuses that have an average visible transmittance of greater than or equal to about 50%, greater than or equal to about 75%, greater than or equal to about 80%, or greater than or equal to about 90%. An apparatus that is "opaque" or "visibly opaque" has an average visible transparency, weighted by the photopic response of an eye of 10% or less for specular transmission. "Semitransparent" apparatuses have an average visible transparency, weighted by the photopic response of an eye of between 10% to 50% for specular transmission. The solar concentrator 10 is visually transparent (with luminophores that have a strongest peak absorbance in the NIR/IR and a strongest peak emission in the NIR/IR, a strongest peak absorbance in the UV and a strongest peak emission in the NIR/IR, or a strongest peak absorbance in the UV and a strongest peak emission in the UV). Non-limiting examples of transparent substrates 14 for the waveguide 16 include glass, low iron glass (such as Diamont® low iron glass, and Planilux® transparent glass from Saint Gobain (Paris, France) and Borofloat® 33 borosilicate glass from Schott (Mainz, Germany)), plastic, poly(methyl methacrylate) (PMMA), poly-(ethylmethacrylate) (PEMA), (poly)-butyl m ethacrylate-co-methyl methacrylate (PBMMA), polyethylene terephthalate (PET), polyurethanes, polydimethylsiloxane (PDMS), and polyimides, such as Kapton® polyimide films (DuPont, Wilmington, DE).

The luminophore 12 can be any luminophore that has the absorbance and emission characteristics described above. Less than or equal to about 50%, less than or equal to about 40%, less than or equal to about 30%, less than or equal to about 20%, less than or equal to about 15%, less than or equal to about 10%, or less than or equal to about 5% of the total light that is absorbed by the luminophore is VIS light.

In various embodiments, the luminophore is a cyanine dye, a cyanine salt, a naphthalocyanine, a naphthalocyanine salt, a thiacarbocyanine, a thiacarbocyanine salt, a polymethine, a polymethine salt, a porphyrin, a porphyrin salt, derivatives thereof, or combinations thereof. Non-limiting examples of luminophores include 3,3'-diehtylthiacarbocyanine iodide (DTCI); 2-[7-(1,3-dihydro-1,3,3-trimethyl-2H-indol-2-ylidene)-1,3,5 heptatrienyl]-1,3,3-trimethyl-3H-indolium iodide (HITCI); 2-[2-[3-[[1,3-dihydro-1,1 dimethyl-3-(3-sulfopropyl)-2H-benz[e]indol-2-ylidene]-2-[4-(ethoxycarbonyl)-1 piperazinyl]-1-cyclopenten-1-yl] ethenyl]-1,1-dimethyl-3-(3-sulforpropyl)-1H benz[e] indolium hydroxide, inner salt, compound with n,n-diethylethanamine (1:1) (IR144); 2-[2-[2-Chloro-3-[(1,3-dihydro-3,3-dimethyl-1-propyl-2H-indol-2 ylidene) ethylidene]-1-cyclohexen-1-yl]ethenyl]-3,3-dimethyl-1-propylindolium iodide (IR780); aluminum 2,3-naphthalocyanine chloride (AlNc); silicon 2,3-naphthalocyanine dichloride (SiNc); 2-[2-[3-[(1,3-Dihydro-3,3-dimethyl-1-propyl-2H-indol-2-ylidene)ethylidene]-2-(phenylthio)-1-cyclohexen-1-yl]ethenyl]-3,3-dimethyl-1-propylindolium perchlorate (IR792); 5,5'-Dichloro-11-diphenylamino-3,3'-diethyl-10,12-ethylenethiatricarbocyanine perchlorate (IR140); zinc 2,11,20,29-tetra-tert-butyl-2,3-naphthalocyanine (ZnNc); 3-(6-(2,5-dioxopyrrolidin-1-yloxy)-6-oxohexyl)-1,1-dimethyl-2-((E)-2-((E)-3-((E)-2-(1,1,3-trimethyl-1H-benzo[e]indol-2 (3H)-ylidene)ethylidene)cyclohex-1-enyl)vinyl)-1H-benzo [e]indolium chloride (Cy7.5 NHS ester); 1-(6-((2,5-dioxopyrrolidin-1-yl)oxy)-6-oxohexyl)-3,3-dimethyl-2-((E)-2-((E)-3-((E)-2-(1,3,3-trimethyl-5-sulfonatoindolin-2-ylidene)ethylidene)cyclohex-1-en-1-yl)vinyl)-3H-indol-1-ium-5-sulfonate (sulfo-Cy7 NHS ester); 1-(6-(2,5-dioxopyrrolidin-1-yloxy)-6-oxohexyl)-3,3-dimethyl-2-((E)-2-((E)-3-((E)-2-(1,3,3-trimethylindolin-2-ylidene) ethylidene)cyclohex-1-enyl)vinyl)-3H-indolium chloride (Cy7 NHS ester; "CY"); 3-(6-(3-azidopropylamino)-6-oxohexyl)-1,1-dimethyl-2-((E)-2-((E)-3-((E)-2-(1,1,3-trimethyl-1H-benzo[e]indol-2(3H)-ylidene)ethylidene)cyclohex-1-enyl)vinyl)-1H-benzo[e]indolium chloride (Cy7.5 azide); 1-(5-carboxypentyl)-3,3-dimethyl-2-((E)-2-((E)-3-((E)-2-(1,3,3-trimethylindolin-2-ylidene)ethylidene)cyclohex-1-enyl)vinyl)-3H-indolium chloride (Cy7 azide); 1,1-dimethyl-3-(6-oxo-6-(prop-2-ynylamino)hexyl)-2-((1E,3E,5E)-5-(1,1,3-trimethyl-1H-benzo[e]indol-2(3H)-ylidene) penta-1,3-dienyl)-1H-benzo[e]indolium chloride (Cy5.5 alkyne); 1-(6-(2-(2,5-dioxo-2,5-dihydro-1H-pyrrol-1-yl) ethylamino)-6-oxohexyl)-3,3-dimethyl-2-((E)-2-((E)-3-((E)-2-(1,3,3-trimethylindolin-2-ylidene)ethylidene)cyclohex-1-enyl)vinyl)-3H-indolium chloride (Cy7 maleimide); 3-(6-(2-(2,5-dioxo-2,5-dihydro-1H-pyrrol-1-yl)ethyl-amino)-6-oxohexyl)-1,1-dimethyl-2-((E)-2-((E)-3-((E)-2-(1,1,3-trimethyl-1H-benzo[e]indol-2(3H)-ylidene)ethyl-idene)cyclohex-1-enyl)vinyl)-1H-benzo[e]indolium chloride (Cy7.5 maleimide); 1-(5-carboxypentyl)-3,3-dim-ethyl-2-((E)-2-((E)-3-((E)-2-(1,3,3-trimethylindolin-2-ylidene)ethylidene)cyclohex-1-enyl)vinyl)-3H-indolium chloride (Cy7 carboxylic acid); 1-Butyl-2-(2-[3-[2-(1-butyl-3,3-dimethyl-1,3-dihydro-indol-2-ylidene)-ethylidene]-2-diphenylamino-cyclopent-1-enyl]-vinyl)-3,3-dimethyl-3H-indolium hexafluorophosphate; 1-Butyl-2-(2-[3-[2-(1-butyl-3,3-dimethyl-1,3-dihydro-indol-2-ylidene)-ethylidene]-2-phenyl-cyclopent-1-enyl]-vinyl)-3,3-dimethyl-3H-indolium hexafluorophosphate; 3-Ethyl-2-[3-[3-(3-ethyl-3H-benzo-thiazol-2-ylidene)-propenyl]-5,5-dimethyl-cyclohex-2-enylidenemethyl]-benzothiazol-3-ium iodide; 1-Butyl-2-(2-[3-[2-(1-butyl-3,3-dimethyl-1,3-dihydro-indol-2-ylidene)-ethylidene]-2-phenyl-cyclohex-1-enyl]-vinyl)-3,3-dimethyl-3H-indolium hexafluorophosphate; 1-Butyl-2-(2-[3-[2-(1-butyl-3,3-dimethyl-1,3-dihydro-indol-2-ylidene)-ethylidene]-2-phenyl-cyclohex-1-enyl]-vinyl)-3,3-dimethyl-3H-indolium hexafluorophosphate; 3-Ethyl-2-[7-(3-ethyl-3H-benzothiazol-2-ylidene)-hepta-1,3,5-trienyl]-benzothiazolium iodide; 1-Butyl-2-[7-(1-butyl-3,3-dimethyl-1,3-dihydro-indol-2-ylidene)-hepta-1,3,5-trienyl]-3,3-dimethyl-3H-indolium hexafluorophosphate; 2-[3-Chloro-5-[1,1-dimethyl-3-(3-methyl-butyl)-1,3-dihydro-benzo[e]indol-2-ylidene]-penta-1,3-dienyl]-1,1-dimethyl-3-(3-methyl-butyl)-1H-benzo[e]indolium hexafluorophosphate; 2-[5-[1,1-Dimethyl-3-(3-methyl-butyl)-1,3-dihydro-benzo[e]indol-2-ylidene]-penta-1,3-dienyl]-1,1-dimethyl-3-(3-methyl-butyl)-1H-benzo[e]indolium hexafluorophosphate; 3,3-Dimethyl-2-[2-[2-chloro-3-[2-[1,3-dihydro-3,3-dimethyl-5-sulfo-1-(4-sulfobutyl)-2H-indol-2-ylidene]-ethylidene]-1-cyclohexen-1-yl]-ethenyl]-5-sulfo-1-(4-sulfobutyl)-3H-indolium hydroxide, innersalt, trisodium salt; 2-[2-(3-[2-[3,3-Dimethyl-5-sulfo-1-(4-sulfobutyl)-1,3-dihydro-indol-2-ylidene]-ethylidene]-2-phenyl-cyclohex-1-enyl)-vinyl]-3,3-dimethyl-5-sulfo-1-(4-sulfobutyl)-3H-indolium hydroxide, inner salt, trisodium salt; 2-[5-[1,1-Dimethyl-3-(4-sulfobutyl)-1,3-dihydro-benzo[e]indol-2-ylidene]-penta-1,3-dienyl]-1,1-dimethyl-3-(4-sulfobutyl)-1H-benzo[e]indolium hydroxide, inner salt, sodium salt; 2-(8-Hydroxy-1,1,7,7-tetramethyl-1,2,3,5,6,7-hexahydropyrido[3,2,1-ij]iquinolin-9-yl)-4-(8-hydroxy-1,1, 7,7-tetramethyl-2,3,6,7-tetrahydro-1H-pyrido[3,2,1-ij]qui-nolinium-9(5H)-ylidene)-3-oxocyclobut-1-enolate (squarylium); and combinations thereof.

In various embodiments, the luminophore is a modified luminescent polymethine dye having at least one of an optical integral (OI) decrease and a Stokes shift increase relative to corresponding base luminescent polymethine dyes that are not modified. The modified luminescent polymethine dyes with an OI decrease and/or a Stokes shift increase enables luminescent solar concentrators with higher power conversion efficiencies (PCE) relative to luminescent solar concentrators including corresponding unmodified luminescent polymethine dyes due to a decrease in reabsorption.

The solar concentrator 10 also comprises a photovoltaic (PV) component, such as a PV cell or PV array. FIGS. 2B-2c show solar concentrators 10', 10'* having the same components as the solar concentrator 10 in FIG. 2A. However, the solar concentrator 10' comprises a PV cell 18 disposed onto an edge 20 of the waveguide 16, and the solar concentrator 10'* comprises a PV cell 18 disposed onto a first surface 24 of the waveguide 16, and PV cells 18 optionally disposed onto the edge 20 and/or onto a second surface 28 that opposes the first surface 24 of the waveguide 16, such that the PV cells 18 are operably coupled to the waveguide 16. By "operably coupled" it is meant that NIR or IR radiation within the waveguide 16, emitted from the luminophore 12, can be transferred to the PV cell 18. In various embodiments, the solar concentrator 10' of FIG. 2B comprises the PV cell 18 on at least one edge of the waveguide. In FIG. 2C, PV cells 18 are located on the first and/or second surface 24, 28 of the waveguide 16 at or near the edge 20, which can be, for example, rectangular, curved, or beveled. By "at or near the edge 20" it is meant that the PV cells 18 abut the edge 20 or are within about 10 cm, within about 5 cm, or within about 2.5 cm of abutting the edge 20. In embodiments where the PV cells 18 are disposed onto surfaces 24, 28 of the waveguides 16, the waveguide surfaces 24, 28 may be roughed at a location of the PV cells 18 or the PV cells 18 can be embedded in the waveguides 16 to ensure that the PV cells 18 are operably coupled to the waveguides 16 by reducing total internal reflection at PV-waveguide interfaces.

FIGS. 2D and 2E show solar concentrators 10', 10'* having the same components as the solar concentrator 10 in FIG. 2A. However, the solar concentrators 10', 10'* of FIG. 2D and S2 include at least one wavelength-dependent mirror 19 and at least one PV cell 18. More particularly, in FIG. 2D, the solar concentrator 10' comprises a PV cell 18 on the first surface 24 of the waveguide 16 at or near the edge 20 and a wavelength-dependent mirror 19 on the edge 20. An optional second wavelength-dependent mirror 19 is disposed onto the second surface 28 of the waveguide 16 at or near the edge 20. In FIG. 2E, the solar concentrator 10'* comprises a PV cell 18 disposed onto the second surface 28 of the waveguide 16 at or near the edge 20 and a wavelength-dependent mirror 19 disposed onto the edge 20. A description of wavelength-dependent mirrors is provided in more detail below with reference to FIG. 3.

FIGS. 2F and 2G show solar concentrators 10", 10'" having the same components as the solar concentrator 10 in FIG. 2A. However, the solar concentrators 10", 10'" have a segmented PV array 22 that is operably coupled to the waveguide 16. In FIG. 2F, the PV array is disposed onto a surface 24 of the waveguide 16. In FIG. 2G, the PV array 22 is disposed within a central region 26 of the waveguide 16, such as in the bulk of the waveguide 16 substrate 14. The PV array 22 can be provided as a coating or spraying on the substrate 14 or by layering dyed sheets as strata between alternating stacks of the substrate 14. Although the PV array 22 may not be visibly transparent, it has a size that is sufficiently small, such that the PV array 22 does not substantially affect the transparent nature of the solar concentrator 10. For example, in various embodiments, the PV array 22 occupies less than or equal to about 20%, less than or equal to about 15%, less than or equal to about 10%, less than or equal to about 5%, less than or equal to about 2.5% of the waveguide 16 substrate 14. Put another way, the PV array 22 blocks less than about 20%, less than or equal to about 15%, less than or equal to about 10%, less than or equal to about 5%, less than or equal to about 2.5% of the light that contacts the solar concentrator 10. In some embodiments, the PV array 22 may be slightly visible by a human viewer as thin lines or dots, or the PV array 22 may be microscopic and invisible to a human viewer.

In various embodiments, the PV array 22 is a mesh comprising wires, microwires, nanowires, ribbons, slivers, spheres, dots, combinations thereof, or the like arranged within or placed on the surface 24 of the waveguide 16 (FIG. 2F). More than one PV array 22 can be utilized to reduce thermal losses. The PV cell 18 of FIG. 2B and the PV array 22 of FIGS. 2F and 2G can comprise any material known in the art. Non-limiting examples of solar array and solar cell materials include germanium (Ge); amorphous germanium (a-Ge); gallium (Ga); gallium arsenide (GaAs); gallium nitride (GaN), gallium indium nitride ($IN_xGa_{1-x}N$, $0<x<1$), silicon (Si); amorphous silicon (a-Si); silicon-germanium (SiGe); amorphous silicon-germanium (a-SiGe); gallium indium phosphide (GaInP); copper indium selenide, copper indium sulfide, or combinations thereof (CIS); copper indium gallium selenide, copper indium gallium sulfide, or combinations thereof (CIGS); cadmium telluride (CdTe); perovskites (PV), such as $CH_3NH_3PbI_3$, $CH_3NH_3PbCl_3$ and $CH_3NH_3PbBr_3$; and combinations thereof.

In some embodiments, the PV array 22 shown in regard to the solar concentrators 10", 10'" of FIGS. 2F and 2G are wired in series and may include adducts, such as spheres or dots. For example, the PV array 22 may comprise a Si sphere solar array connected by thin-wire electrical connections. In one embodiment, the PV array 22 comprises spheres that are wired together to form a mesh. Advantageously, using spherical or multi-sided PV arrays 22 further increases system efficiency, as each cell can capture both direct and indirect sunlight at multiple angles. The PV array 22 can be located at different positions within the substrate 14, at or near the surfaces 24, or the PV array 22 can have a thickness that is about the same overall thickness of the waveguide 16. In some embodiments, the solar concentrator 10", 10'" can comprise a plurality of PV arrays 22, located at different positions within the substrate 14.

By positioning segmented PV arrays 22 at the top or bottom surfaces 24 of the waveguide 16, it is possible to capture luminesced light before it is lost optically due to dye reabsorption. Alternatively, the PV arrays 22 can be embedded within the waveguide 16. This loss of reabsorption is particularly beneficial for fluorescent materials with small Stokes shifts. Depending on where the PV arrays 22 are positioned in the waveguide 16, the luminophore 12 can be either embedded in, or juxtaposed to, the PV array 22. Also, by positioning the PV arrays 22 at the top or bottom surface 24 of the waveguide 16, a fraction of forward emitted light can be captured, which further reduces optical losses and enhances the efficiency of spatially segmented PV arrays 22 by utilizing a greater fraction of NIR light between cells.

As shown in FIG. 3, a solar concentrator 50 can comprise a first wavelength-dependent mirror 52. The first wavelength-dependent mirror 52 can have a reflectivity of NIR light corresponding to only an emission spectrum of a modified luminophore as shown in graph 80. Therefore, the first wavelength-dependent mirror 52 is transparent to visible light 54, but reflects NIR light 56 in an emission range shown in graph 80. The first wavelength-dependent mirror 52 can be functionally coupled to a first surface 58 of the solar concentrator 50, which comprises a modified luminophore. Alternatively, the first wavelength-dependent mirror 52 can be functionally coupled to a second surface 60 of the solar concentrator 50, or to both surfaces 58, 60. In other embodiments, the waveguide redirecting material is on the second surface 60 or embedded within the waveguide.

With further reference to FIG. 3, the solar concentrator 50 can comprise a second wavelength-dependent mirror 62. The second wavelength-dependent mirror 62 can have a reflectivity of NIR light corresponding to both absorption and emission spectra of a modified luminophore as shown in graph 90. The second wavelength-dependent mirror 62 is transparent to visible light 54, but reflects NIR light 56 in an emission range shown in graph 90. The second wavelength-dependent mirror 62 can be functionally coupled to the first surface 58 of the solar concentrator 50, to the second surface 60 of the solar concentrator 50, or to both surfaces 58, 60. In one embodiment, the first wavelength-dependent mirror 52 is functionally coupled to the first surface 58 of the solar concentrator 50, and the second wavelength-dependent mirror 62 is functionally coupled to the second surface 60 of the solar concentrator 50. As described above, a photovoltaic array can be positioned on the first surface 58, the second surface 60, or within the waveguide. In various embodiments, the solar concentrator 50 comprises a plurality of solar arrays positioned at any of the first surface 58, the second surface 60, or within the waveguide between the first and second surfaces 58, 60. In yet other embodiments, the solar concentrator 50 comprises a solar cell positioned at an edge of the solar concentrator 50 that is adjacent to the first and second surfaces 58, 60.

Incorporation of visibly transparent, selective NIR wavelength-dependent mirrors 52, 62 in transparent photovoltaics (TPVs) substantially improves power conversion efficiencies by 50-100%. Similarly, the incorporation of these mirrors 52, 62 improves the optical efficiency at low plate dimension by greater than about 20%, while reducing the quantity of modified luminophore needed by about half for a given optical density. For solar concentrator sizes of greater than about 0.5 m$^2$, these mirrors 52, 62 are helpful in mitigating any surface and bulk scattering imperfections that could reduce system efficiencies. The mirrors 52, 62 can be coatings that improve collector absorption and increase waveguiding. Moreover, these coating layers are very similar to low-e-coatings that are already ubiquitously deployed and can complement or replace much of their functionality for heat rejection. Alternating layer combinations of $TiO_2$, $SiO_2$, and $Al_2O_3$ can be grown by e-beam evaporation, pulsed laser deposition, plasma-enhanced sputtering, thermal deposition, chemical vapor deposition, or solution deposition to optimize overall color impact and performance.

U.S. patent application Ser. No. 14/220,850 to Lunt et al., filed on Mar. 20, 2014, and U.S. Provisional Patent Application No. 62/669,184 to Lunt et al., filed on May 9, 2018 describe various TLSC architectures that can be utilized with the current SC devices and are each incorporated herein by reference in their entirety.

With further reference to FIG. 1A, and as explained above, the waveguide 16 is visibly transparent and comprises a luminophore 12 (or a plurality of luminophores 12) as shown in FIG. 2A. The waveguide 16 is characterized by a first refractive index. In various embodiments, the first refractive index is greater than or equal to about 1.45 and less than or equal to about 2.5.

The film 11 is visibly transparent has a second refractive index. The second refractive index (of the film 11) is less than the first refractive index (of the waveguide 16). More particularly, the second refractive index is lower than the first refractive index by greater than or equal to about 0.1. Therefore, when the first refractive index (of the waveguide) is, for example, 1.5, the second refractive index is greater than or equal to about 1.05 to less than or equal to about 1.4. Also, when the first refractive index is, for example, 2.5, the second refractive index is greater than or equal to about 1.05 and less than or equal to about 2.4.

The film 11 has a thickness $T_f$ of greater than or equal to about 0.01 μm to less than or equal to about 1 mm, greater than or equal to about 0.1 μm to less than or equal to about 1 mm, greater than or equal to about 10 μm to less than or equal to about 800 μm, greater than or equal to about 100 μm to less than or equal to about 500 μm. The film 11 can be rigid or flexible and has a positive Young's modulus of less than or equal to about 10 MPa, such as a Young's modulus of greater than 0 to less than or equal to about 10 MPa, greater than 1 to less than or equal to about 9 MPa, or greater than 3 to less than or equal to about 7 MPa.

The film 11 has a Shore hardness of greater than or equal to about 40 D, greater than or equal to about 45 D, greater than or equal to about 50 D, greater than or equal to about 55 D, greater than or equal to about 60 D, greater than or equal to about 70 D, or greater than or equal to about 80 D or a pencil hardness of greater than or equal to about 1H, greater than or equal to about 2H, greater than or equal to about 3H, of greater than or equal to about 4H. Additionally, the film has a tensile strength of greater than or equal to about 0.05 MPa, greater than or equal to about 0.25 MPa, greater than or equal to about 0.5 MPa, or greater than or equal to about 0.75 MPa.

Figure 1B:
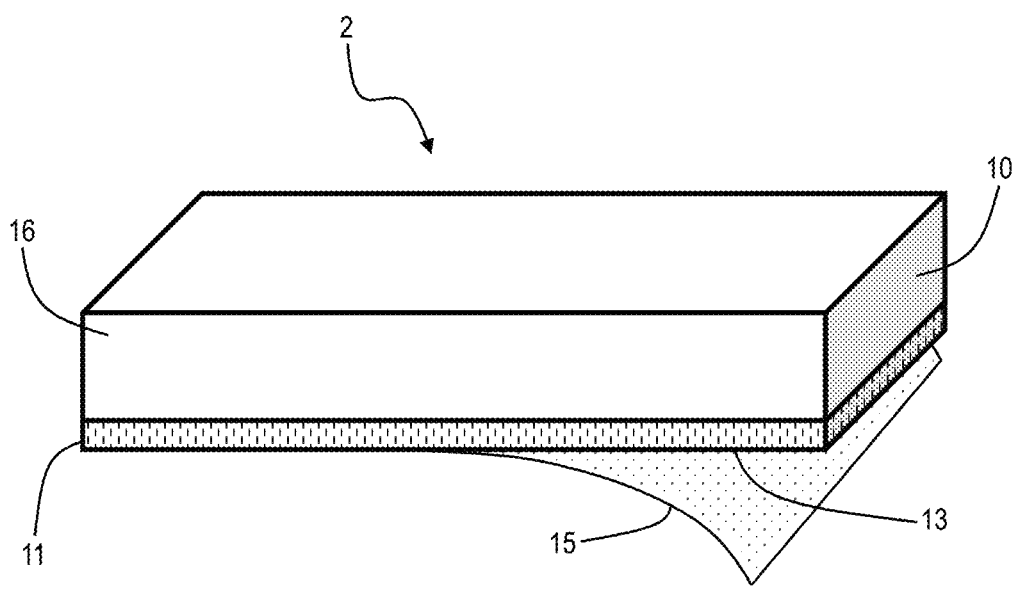
FIG. 1B is a schematic illustration of the solar concentrator device according to FIG. 1A, wherein a non-adhesive sheet or material is being peeled off of the solar concentrator device to expose an adhesive surface in accordance with various aspects of the current technology.

The film 11 has a surface 13 that is adhesive, wherein the surface 13 is opposite to a surface that is disposed onto the waveguide 16. Therefore, either the film 11 itself is an adhesive, or the film 11 has an adhesive layer that provides an adhesive surface 13, wherein the film is located between the adhesive layer and the waveguide 16. In various embodiments, and as shown in FIG. 1B, the adhesive surface 13 is covered by a non-adhesive sheet or material 15 that is configured to be peeled off of the SC device 2 to expose the adhesive surface 13. Accordingly, the SC device 2 can be applied to an arbitrary surface by first removing the non-adhesive sheet or material 15 to expose the adhesive surface 13, and then disposing the adhesive surface 13 onto the arbitrary surface, similar to removing a sticker from a backing and applying the sticker to surface.

The film 11 comprises an oxide, a metal oxide, a ceramic, a glass, a polymer, or a combination thereof. In various embodiments, the film comprises poly(1,1,1,3,3,3-hexafluoroisopropyl acrylate), poly(2,2,3,3,4,4,4-heptafluorobutyl acrylate), poly(2,2,3,3,4,4,4-heptafluorobutyl methacrylate), poly(2,2,3,3,3-pentafluoropropyl acrylate), poly(1,1,1,3,3,3-hexafluoroisopropyl methacrylate), poly(2,2,3,4,4,4-hexafluorobutyl acrylate), poly(2,2,3,4,4,4-hexafluorobutyl methacrylate), poly(2,2,3,3,3-pentafluoropropyl methacrylate), poly(2,2,2-trifluoroethyl acrylate), poly(2,2,3,3-tetrafluoropropyl acrylate), poly(2,2,3,3-tetrafluoropropyl methacrylate), poly(2,2,2-trifluoroethyl methacrylate), $SiO_2$, SiOF, $MgF_2$, $CaF_2$, nanoporous $SiO_2$, nanoporous $MgF_2$, nanoporous ITO, nanoporous $CaF_2$, MY131-MC, MY132-MC, MY133-MC, MY136-MC, AR-138, AR-139, AR-141, (see world wide web. mypolymers.com/products?i=11 for MY131-MC, MY132-MC, MY133-MC, MY136-MC, AR-138, AR-139, and AR-141) or a combination thereof.

In some embodiments, as shown in FIG. 4, the SC device 2 is disposed onto a substrate 17, which is an arbitrary surface by way of the adhesive surface 13 of the film 11. Accordingly, the film 11 is located between the substrate 17 and the waveguide 16. The substrate 17 is not limiting, and may be flat, curved, bent, or contoured. Non-limiting examples of substrate 17 include a surface of a vehicle, a surface of a billboard, a surface of a building, a surface of a mobile electronic device, or a surface of a greenhouse. For example, in various embodiments, the substrate 17 is a vehicle surface, which may be flat, curved, bent, or contoured, and the SC device 2 further comprises a topcoat disposed onto an exposed surface of the waveguide 16, wherein the topcoat is transparent to at least one of UV, VIS, NIR, and IR light.

As discussed above, the waveguide 16 and the film 11 are both visibly transparent, i.e., have an average visible transmittance as described above. Collectively, the SC device 2, which includes the waveguide 16 and the film 11, has a color rendering index (CRI) of greater than or equal to about 80, greater than or equal to about 85, greater than or equal to about 90, or greater than or equal to about 95 with AM1.5 solar spectrum as a light source. Alternatively, the SC device 2 and the substrate has a reflected color rendering index (CRI) of greater than or equal to about 80, greater than or equal to about 85, greater than or equal to about 90, or greater than or equal to about 95 compared to the substrate alone when illuminated with the AM1.5 solar spectrum as the light source. Accordingly, when disposed onto the substrate 17, the color coordinates of the substrate with the SC device 2 are within about 50%, within about 30%, within about 25%, within about 20%, within about 15%, within about 10%, or within about 5% of the color coordinates of the substrate alone. As used herein, "color coordinates" are quantitative metrics describing the dominant distribution of visible wavelengths in human color perception. Non-limiting examples of color coordinates include International Commission on Illumination (CIE) 1931 x,y,x, CIELUV 1976 L*u*v*, and CIELAB L*a*b*. Therefore, the appearance of the substrate 17 with the SC device 2 is substantially indistinguishable from the appearance of the substrate 17 alone.

With reference to FIG. 5A, in some embodiments the SC device 2 further comprises a second SC device 2a disposed onto the solar concentrator 10, the second SC device 2a including a second solar concentrator 10a comprising a second waveguide 16a having a second luminophore and a second photovoltaic component operably coupled to the second waveguide 16a, and a second film 11a coupled to the second SC device 2a, the second film 11a having a refractive index of greater than or equal to about 1.05 to less than or equal to about 1.45. The second waveguide 16a, the second photovoltaic component, and the second film 11a are both visibly transparent, as defined above. Here, the second film 11a has a second adhesive surface 13a and is positioned between the solar concentrator 10 and the second solar concentrator 10a. The result is a multijunction concentrator that enables isolation between concentrators so that one concentrator does not absorb the emission of the other concentrator. The SC device 2 and the second SC device 2a individually have the components described herein. As such, the SC device 2 and the second SC device 2a can be the same or different and have independent absorbance and emission characteristics that fulfill the requirements set forth above.

In other embodiments, the SC device 2 includes a stack comprising a plurality of additional solar concentrators disposed onto the SC device 2 on a surface opposite to the film 11. For example, as shown in FIG. 5A, a third SC device 2b comprising a third solar concentrator 10b comprising a third waveguide 16b having a third luminophore and a third photovoltaic component operably coupled to the third waveguide 16b, and a third film 11b having a third adhesive surface 13b is disposed onto an exposed surface of the second waveguide 16a by way of the third adhesive surface 13b. Therefore, each of the plurality of additional solar concentrators 10a, 10b comprises an additional waveguide 16a, 16b comprising an additional luminophore, an additional photovoltaic component operably coupled to the additional waveguide 16a, 16b, and an additional film 11a, 11b having a refractive index of greater than or equal to about 1.05 to less than or equal to about 1.45, each of the additional waveguide 16a, 16b, the additional photovoltaic component, and the additional film 11a, 11b being visibly transparent as discussed above. No additional film is directly disposed onto another additional film. The plurality of additional solar concentrator of the stack includes greater than or equal to 2 additional solar concentrators to less than or equal to 10 additional solar concentrators.

In another embodiment, as shown in FIG. 5B, the SC device 2 is stacked onto a visibly transparent solar concentrator 10a by way of the film 11. However, the visibly transparent solar concentrator 10a does not include an adhesive film of its own. Here, the resulting stack can be used for opaque, semi-transparent, and transparent freestanding surfaces, such as windows. Moreover, additional SC devices 2 can be stacked onto the SC device 2 shown in the figure by way of additional films 11.

The current technology also provides a method of fabricating a solar concentrator device. The solar concentrator device can be any solar concentrator device described herein. The method includes obtaining a solar concentrator including a waveguide comprising a luminophore and having a first refractive index, and a photovoltaic component operably coupled to the waveguide. The method also comprises disposing a film onto a surface of the solar concentrator. The film has a second refractive index that is lower than the first refractive index of the waveguide. The waveguide and the film are visibly transparent. In one embodiment, the disposing the film onto the surface of the solar concentrator comprises depositing the film onto the surface of the solar concentrator by glancing angle deposition. In another embodiment, the disposing the film onto the surface of the solar concentrator comprises depositing the film onto the surface of the solar concentrator by solution deposition, such as by spin coating, drop casting, spray coating, dipping, or doctor blading.

Embodiments of the present technology are further illustrated through the following non-limiting example.

Example

Visibly transparent luminescent solar concentrators (TLSCs) can convert existing window glazing systems and non-window surfaces into solar energy harvesting resources, dramatically improving energy utilization efficiency. While there has been a significant interest in improving the power conversion efficiency, little attention has been focused on the challenges of integrating luminescent solar concentrators (LSCs) onto non-window surfaces or onto windows with significant infrared absorption coefficients. In these situations, the total internal reflection (TIR) can be effectively disabled when LSCs are directly and seamlessly integrated onto surfaces that are highly absorptive or scattering to infrared light.

Here, a route to enable the performance of TLSC devices as they are installed onto arbitrary surfaces is demonstrated. An optical approach to confine the TIR to the optically transparent waveguide and prevent surface absorption that can effectively turn off the TLSC device is developed. Conceptually, a neat layer with a low refractive index is coated onto the back side of the TLSC to function as cladding for the waveguide as shown in FIG. 6. NIR-selective harvesting organic dye/polymer host composite is then coated onto the front surface of the waveguide as the luminophore film. Due to the NIR-absorption of the organic dye combined with visible/infrared transparency of the low refractive index film, the overall visual impact of the whole TLSC device is minimized, while the functionality and aesthetic quality of the surfaces underneath are largely unaffected. Both the current density-voltage (J-V) characteristics and distance-dependent external quantum efficiency (EQE) measurements show that the insertion of the low refractive index film can effectively re-enable the LSC device and substantially improve the power conversion efficiency (PCE) and scalability in comparison to the TLSC control devices without such an approach. This design provides a simple and scalable method to resolve the challenge of seamless integration of TLSCs onto any surface to help realize the full potential of LSC and TLSC devices beyond windows.

Experimental Methods

Module Fabrication: "Air Control" (air as the claddings on both sides of the waveguide) TLSC device: 200 mgL$^{-1}$ Cy7-CA ethanol solution is mixed with mounting medium (Fluoroshield F6182, Sigma-Aldrich) at a volume ratio of 1:2. This mixture is drop-cast on the front surface of a 5.08 cm×5.08 cm×0.635 cm glass sheet (for photovoltaic characterization) and allowed to dry for 6 hours in a glove-box filled with nitrogen gas ($O_2$, $H_2O$<1 ppm), resulting in a layer thickness of 0.5 mm. Dichloromethane is mixed with (poly)-butyl methacrylate-co-methyl methacrylate (PBMMA) (Sigma-Aldrich) at a volume ratio of 1:1. This mixture is then drop-cast onto the dye/waveguide composite film to make a smooth and flat surface to avoid light scattering in the waveguide and act as a protection layer. The same layer structure is applied for 2.54 cm×2.54 cm×0.1 cm (for PL measurements) or 1.27 cm×1.27 cm×0.07 cm (for QY measurements). For photovoltaic measurements, single-crystalline solar cells (Vikocell) are laser cut into 5.08 cm×0.635 cm strips for PCE and corresponding EQE measurements and 10.16 cm×0.635 cm strips for normalized position-dependent EQE measurements. For PCE measurements, two PV strips are mounted on orthogonal edges using index matching gel (Thorlabs) to attach the PV strips on glass edges and are connected in parallel. Each device is tested with the same PV cells. The remaining two edges are covered with specular film reflector (DF2000MA series, 3M). For EQE measurements, one PV strip is attached to one edge of the waveguide, with the other three edges painted black.

Low index polymer spacers are coated onto the backside of the waveguide sheet by doctor blade and the thickness of this low refractive index film ("n=1.30" or "n=1.38") is controlled to 0.5 mm. A PBMMA film is then formed on top of the low refractive index layer as a polymer protection film by drop-casting. This PBMMA film is necessary for good adherence of the following paint layer, as well as to protect the previously coated low index layers from redissolution. After the PBMMA film is dried, paint is sprayed uniformly to form a dense and smooth paint film. The front surfaces and edges of the "n=1.30," "n=1.38," and "Paint Control" (just a paint layer on the back surface of the waveguide) TLSCs are the same as the "Air Control" TLSC.

Optical Characterization: Specular transmittance of both solutions and films are measured using a dual-beam Lambda 800 UV/VIS spectrometer in the transmission mode. The PL for Cy7-CA in both solutions and polymer films are measured by using a PTI QuantaMaster 40 spectrofluorometer with excitation at 675 nm. Quantum yield measurements are tested by using Hamamatsu Quantaurus fluorometer and excitation ranges in scan mode (10 nm per scan step) are adjusted to 700-750 nm for Cy7-CA. Six QY values are collected and the reported QY is averaged from these six QY values with corresponding excitation wavelengths.

Module Photovoltaic Characterization: J-V measurements are obtained using a Keithley 2420 source measurement under simulated AM1.5G solar illumination (xenon arc lamp with the spectral-mismatch factor of 0.97±0.03 for all the devices being tested). The light intensity is calibrated with an NREL-calibrated Si reference cell with KG5 filter. For position-dependent EQE measurements, the excitation beam is obtained by directing chopped incident light from a quartz tungsten halogen lamp through a monochromator. EQE scans are performed by positioning the monochromatic excitation beam from a fiber perpendicular to the LSC waveguide front surface at various distances from a single edge-mounted Si PV cell. The measured EQE is corrected by the geometric factor, $g=\pi/\tan^{-1}(L/2d)$, which accounts for the different angle subtended by the solar cell at various distance d, where L is the LSC plate length. Both PCE and EQE measurements are tested by using the same TLSC to match the $J_{SC}$ with the integrated $J_{SC}$, and a matte black background is placed on the back of the tested TLSC device to eliminate the illumination from the environment or reflection (double pass) for both PCE and EQE measurements. The same PV cells are also mounted around the edge to eliminate any PV-to-PV variations in performance.

Optical Modeling: In considering reabsorption losses from the overlap in the absolute absorption and normalized emission spectra, the optical efficiency $\eta_{opt}(\lambda)$ of the "Air Control" TLSC system is numerically evaluated in Matlab as a function of distance d, plate length L, plate thickness $t_0$ and dye/polymer film thickness t.

Results 1-(5-carboxypentyl)-3,3-dimethyl-2-((E)-2-((E)-3((E)-2-(1,3,3-trimethylindolin-2ylidene)ethylidene)cyclohex-1-enyl)vinyl)-3H-indolium chloride (Cy7-CA) is used as the NIR-selective harvesting luminophore for all the TLSC devices. The molecular structure of Cy7-CA is shown in FIG. 7A, and the absorption/emission spectra in both dichloromethane (DCM) solution and in polymer matrix are plotted in FIG. 7B. The absorption and photoluminescence spectra of the Cy7-CA in polymer matrix and in DCM solution are very close to each other: the absorption spectra peak at 760 nm for DCM solution and 762 nm for dye/polymer composite film, while the NIR emission peaks are 787 nm for DCM solution and 788 nm for dye/polymer composite film. The photoluminescent quantum yield is 24±1 in DCM solution and 19±1 in polymer matrix.

TLSC devices are formed on borosilicate glass sheets with an active area of 25.8 cm$^2$. To demonstrate the principle of this design, cyanine dye molecules are dissolved in ethanol, mixed with a polymer host, and then drop-cast onto glass sheets to form dye/polymer composite films. Laser-cut Si photovoltaic cells are mounted around the two orthogonal edges and connected in parallel and the other two orthogonal edges are taped with reflective films. TLSC devices with four different layer structures as shown in FIG. 6 are made and their photovoltaic characteristics are compared. Two different commercially available low index polymers (n=1.30 and n=1.38) are utilized to compare to an air control (air as the claddings on both sides of the waveguide) and a paint control (just a paint layer on the back surface of the waveguide). The current density versus voltage (J-V) characteristics of these TLSCs are shown in FIG. 7C along with the absolute position dependent external quantum efficiency (EQE) of the air-control in FIG. 7D and the relative EQEs for the other configurations in FIGS. 8A-8D. The measured short-circuit current density ($J_{SC}$) of the device with Cy7-CA is 1.11±0.02 mAcm$^{-2}$, with an open-circuit voltage ($V_{OC}$) of 0.47±0.01 V and a fill factor (FF %) of 55±1%, leading to an efficiency (0.30±0.01%), similar to previous reported Cy7-CA devices, considering the larger area tested here (devices with a smaller area of 4 cm$^2$ show a PCE of 0.40±0.03%). In contrast to the "Air Control" TLSC, the "Paint Control" TLSC exhibits a very poor photovoltaic behavior, showing a $J_{SC}$ of 0.31±0.02 mAcm$^{-2}$, $V_{OC}$ of 0.38±0.01 V, FF % of 54±1%, and a PCE of only 0.07±0.01%. When the low-index polymers, "n=1.30" and "n=1.38," are integrated into the TLSC devices, the corresponding PCE is improved to 0.21±0.03% and 0.16±0.01%, with $J_{SC}$ of 0.82±0.09 mAcm$^{-2}$ and 0.62±0.02 mAcm$^{-2}$, $V_{OC}$ of 0.46±0.01 V and 0.43±0.01 V, and FF % of 56±1% and 55±1%, respectively. Thus, adding these low refractive index films significantly restore their photovoltaic performance compared to the "Paint Control" TLSC. FIG. 7D shows the external quantum efficiency (EQE) spectra of the "Air Control" TLSC as a function of excitation position. The EQE peak position of the TLSC (i.e. at 760 nm) matches the absorption spectrum of Cy7-CA in polymer matrix in FIG. 7B and no direct excitation of the edge mounted solar cell is observed in any of the EQE spectra. The calculated photocurrent density from integrating the product of the EQE and AM 1.5G solar spectra is 0.91 mAcm$^{-2}$ of the "Air Control" TLSC, which is in good agreement with the $J_{SC}$ extracted from J-V measurements.

These data show that the presence of the low refractive index film imparts minimal visual impact, such as absorptive coloring or tinting. The transmission spectra of the low refractive index films are compared with that of waveguide alone in FIG. 7E. The transmission spectrum curves of both the "n=1.30" and "n=1.38" films on the waveguide sheets nearly overlap with that of the waveguide alone across the whole visible spectrum (from 400 nm to 900 nm). The corresponding average visible transmittance (AVT) and color rendering index (CRI) for "n=1.30" is 91.3% and 99.8, respectively. For "n=1.38," the AVT is 90.6% and CRI is 99.0, compared to 92.2% and 100 for the waveguide alone, respectively. The transmission spectrum of the paint film is also included in the same plot, which indicates that the paint film completely blocks the entire incident light from 300 nm to 900 nm. To check the validity of photon balance from the independent EQE, transmission (T(A)), and reflection (R(A)) spectra measurements of the "Air Control" TLSC device, it is shown in FIG. 7F that EQE(λ)+R(λ)+T(λ)≤1 is satisfied at each wavelength. The transmission spectrum of the "Air Control" TLSC device has a corresponding AVT of 87.7% and CRI of 92.3. For the majority of window and glazing system applications, a device should have AVT greater than 65-75% and CRI greater than 90, and therefore, the "Air Control" TLSC with Cy7-CA is well suited for this requirement. Although there is not a similar standard for transparent PVs applied to non-transparent surfaces, higher AVT and CRI will always lead to better color fidelity (quantitatively, for example, with CIE chromaticity coordinates) of the original aesthetic quality of the back surfaces, which is critical in many applications, and particularly important for automobiles.

To explore the impact of the low refractive index film on device scalability, TLSC systems with the four different structures are characterized by position-dependent EQE as a function of the distance (d) from the excitation source to the same edge-mounted PV cell. Multiple EQE scans are taken for each TLSC system, as d is increased from 15 mm to 95 mm at 10 mm intervals. The EQE spectra of the TLSC devices with four different layer structures are plotted in FIGS. 8A-8D and the EQE peak values of each individual scan are extracted and plotted in FIG. 9A.

Discussion

The wavelength-dependent EQE of an LSC ($EQE_{LSC}(\lambda)$) can be expressed as:

$$EQE_{LSC}(\lambda) = \eta_{opt}(\lambda) \cdot \frac{\int EQE_{PV}(\lambda')PL(\lambda')d\lambda'}{\int PL(\lambda')d\lambda'} \qquad \text{Equation 1}$$

where $\eta_{opt}(\lambda)$ is the LSC optical efficiency (number of photons emitted at the edge per number of photons incident) at the absorption wavelength of the luminophore and the integral represents the EQE of the edge-mounted PV cell over the emission wavelengths of the luminophore. The integrals here are performed over the wavelength range of the PL emission (λ'), not the wavelength of the incident light (λ). In the emission wavelength range Cy7-CA (700 to 850 nm), the edge-mounted Si PV show a nearly constant EQE (approximately 90%) so that Equation 1 simplifies to $EQE_{LSC}(\lambda)=\eta_{opt}(\lambda)\cdot EQE_{PV}$, where $EQE_{PV}\cong 0.90$. The optical efficiency at a specific wavelength can be further expanded into the product of five loss factors:

$$\eta_{opt}(\lambda)=(1-R_f)\cdot A(\lambda)\cdot \eta_{PL}\cdot \eta_{Trap}\cdot \eta_{RA} \qquad \text{Equation 2}$$

where $R_f$ is the reflection of the incident light at the front surface, so the term $(1-R_f)$ is the portion of incident solar flux entering the TLSC device without being reflected, A(λ) is the normal incidence absolute absorption spectrum (calculated by A(λ)=1−R(λ)−T(λ)), R(λ) is the reflection from the luminophore, $\eta_{PL}$ is the luminescence efficiency of the luminophore (the QY of the luminophore in polymer matrix), $\eta_{Trap}$ is the photon trapping (or waveguiding) efficiency, and $\eta_{RA}$ is the efficiency of suppressing reabsorption. Since all four TLSC devices possess the same polymer encapsulation film, dye/polymer matrix film, and waveguide, these loss factors ($R_f$, A(λ), $\eta_{PL}$) are essentially independent of the low refractive index film. For simple waveguides, the trapping efficiency ($\eta_{Trap}$) is a function of the refractive index of the waveguide cladding: $\eta_{Trap}=\sqrt{1-n_{cladding}^2/n_{waveguide}^2}$. As for the case of the waveguide having two claddings with different refractive index values, $\eta_{Trap}$ is dominated by the cladding side with lower refractive index due to its larger critical angle ($\theta_C$) for TIR at the waveguide/cladding interface. The reabsorption efficiency $\eta_{RA}$ is a function of both $\eta_{Trap}$ and $\eta_{PL}$, but it is weakly dependent on the refractive index of the waveguide and cladding compared to $\eta_{Trap}$ itself. Thus, the difference in $EQE_{LSC}(\lambda)$ roll-off behavior should be dominated by $\eta_{Trap}$. As shown in FIG. 9A, the "Air Control" TLSC has the highest trapping efficiency, so the EQE decay trend is the slowest, since it has both front and back surfaces in contact with air. Once the backside of the waveguide is configured with an absorptive paint film, the TIR is no longer confined within the waveguide and the light penetrates into the paint layer. This results in the parasitic absorption and scattering of the light from the paint layer that leads to rapid EQE decays for the "Paint Control" and a factor of 4 times lower PCE. Some remaining EQE signal can still be collected at very short distances (small d) as shown in FIG. 8D, which is mainly from a very small portion of the emitted photon flux reaching the edge-mounted PV directly through the waveguide, but not via TIR. This explains why some residual short-circuit current density can still be detected from the J-V measurement for the corresponding TLSC device in FIG. 7C. This straight-through luminescent is strongly sensitive to the waveguide thickness, where there is a smaller emission angle range for photons to reach the edge as the waveguide thickness decreases or the length of the device increases. Nonetheless, the PCE is reduced by nearly 75%, even for devices of 5 cm length, and would be an even greater loss as the device size is increased.

"Paint Control" TLSC devices with different colors (blue, green, red and white) are also fabricated to mimic arbitrary back surfaces. Their EQE peak values are extracted as a function of d and plotted in FIG. 9B. All the colored "Paint Control" TLSCs show very similar EQE decay trends compared to the black "Paint Control" in FIG. 9A, since absorption and scattering losses are effectively equivalent.

With the low refractive index film inserted between the waveguide and the paint, the EQE roll-off is mitigated substantially for both n=1.30 and n=1.38. For n=1.30, the decay is within 80-85% of the air control, which indicates that TIR within the waveguide is essentially fully restored. Integration of lower index could further enhance the refractive index contrast between the waveguide and the its cladding, and thus, reduce this loss to regain the last 15-20%.

For polymers, there are several major methods to reduce the refractive index, including chemical modifications and creating nanoporosity (air-gaps) in the films. Incorporating fluorinated functional groups into the main chains or side chains of the polymer structures can be an effective strategy, where fluorine atoms can effectively reduce the dipole moment by localizing the electron density in C—F σ bond, thereby reducing the total molecular polarizability that is tied to the polarizability. Utilizing this approach, indices in the range of 1.1-1.3 have been demonstrated.

As an alternative to low-index polymer layers, inorganic optical cladding can be deposited as an interlayer. For example, the refractive indices of $MgF_2$, $CaF_2$ and $SiO_2$ dense coating films are $n_{mgF_2}$=1.39, $n_{CaF_2}$=1.44 and $n_{SiO_2}$=1.46, and they are among the materials with the lowest refractive index values. Increasing the porosity volume fraction of these materials in nanoscale can further reduce the refractive index to less than 1.1 and can be obtained with glancing angle deposition.

While porous polymer and inorganic films have shown quite low refraction indices, it is still difficult to synthesize mechanically robust layers with minimal haze for n less than 1.3 for practical applications. For example, porous structures typically have limited mechanical stability and can become collapsed with excess pressure. Additionally, nanoporous structures can also create additional light scattering, which is as detrimental for light trapping as the underlying surface. Nonetheless, further enhancements in the waveguide could be achieved with higher complexity optical designs, such as distributed Bragg reflectors with tunable stop bands matching the luminescent wavelength range of the luminophores, but with greater impact on the color coordinates that vary with angle.

To further approach the scaling of the air TLSC devices, it is possible to replace the current waveguide with higher refractive index material ($n_{waveguide}$>1.5). The optimum of the product of the reflection and trapping efficiencies (($1-R_f$)·$\eta_{Trap}$) of simple waveguides for different $n_{cladding}$ (1.0 to 1.4) scenarios as a function of $n_{waveguide}$ is plotted in FIG. 9C. With the higher $n_{cladding}$ provided, the higher $n_{waveguide}$ is required to obtain the maximum product, approximately 0.77. Polymers are often the most suitable waveguide materials, since luminophores can be embedded directly into the waveguide via mixing or coated as a luminophore/matrix film onto a surface. Introduction of aromatic rings, halogen atoms (except for fluorine), and sulfur atoms are the most common ways to adjust the polymer refractive index to approximately 1.70 with good visible transparency. Polymer materials with a refractive index greater than 1.70 have been developed, but are typically much more costly and very few are commercially available. Practically, expanding the polymer refractive indices from 1.30 to 1.70 is wide enough for the purpose of waveguiding enhancement. For example, if the refractive index of the waveguide is $n_{waveguide}$=1.70 with a low refractive index film cladding of n=1.30 coated on the backside then $\eta_{Trap}$ can reach 64.5%, which is very close to the "Air Control" scenario of 74.5%.

The strategy of adjusting the refractive index of different layers in TLSC can also be applied to 1) colorful LSC system, when the LSC devices are integrated onto the areas where the aesthetic quality are not a concern and which gives more freedom in the luminophore selection; 2) insertion between multijunction LSCs as an interlayer to separate and protect the luminescent flux from each subpanel being reabsorbed by the lower bandgap luminophore; 3) integration onto the transparent surfaces where the glass does not have sufficient transparency in the infrared spectrum; and 4) incorporation of the low refractive index layer along with other flexible components (waveguide, luminophore layer and PV), resulting in mechanically flexible LSC or TLSC devices that can be more readily integrated onto curved surfaces.

Conclusion

In conclusion, it is shown that integrating TLSCs onto to highly absorptive and colorful painted surfaces results in a nearly 80% drop in performance. To overcome this deployment limitation, a NIR harvesting visibly transparent LSC device is fabricated that can be seamlessly integrated onto arbitrary surfaces. This is achieved by deploying a low refractive index optical spacer between the backside solid surface and the TLSC waveguide. J-V characteristics show a large PCE improvement of the TLSC over a painted surface. The waveguide sheet coated with such low refractive index film show AVTs of greater than 90% and CRIs of greater than 99, so these low refractive index films add very little visual impact to the overall aesthetic quality of the TLSC system. Moreover, the scalability is dramatically increased, enabling devices that can be made larger than several centimeters, while still retaining much of their performance. Thus, a simple and cost-effective optical design to make TLSCs deployable on any surface without visual impact on the surface underneath is provided, further accelerating the potential for these clean, low-cost solar technologies.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A solar concentrator device comprising:
   a waveguide comprising a luminophore and having a first refractive index, the luminophore being distributed across the waveguide;
   a photovoltaic component operably coupled to, and in direct contact with, the waveguide; and
   a film disposed onto a surface of the waveguide and configured to be disposed onto a substrate, wherein the film is smooth and has a second refractive index that is lower than the first refractive index of the waveguide, and the film extends uninterrupted across the entire surface of the waveguide,
   wherein the waveguide and the film are visibly transparent, and
   wherein the film comprises poly(1,1,1,3,3,3-hexafluoroisopropyl acrylate), poly(2,2,3,3,4,4,4-heptafluorobutyl acrylate), poly(2,2,3,3,4,4,4-heptafluorobutyl methacrylate), poly(2,2,3,3,3-pentafluoropropyl acrylate), poly(1,1,1,3,3,3-hexafluoroisopropyl methacrylate), poly(2,2,3,4,4,4-hexafluorobutyl acrylate), poly(2,2,3,4,4,4-hexafluorobutyl methacrylate), poly(2,2,3,3,3-pentafluoropropyl methacrylate), poly(2,2,2-trifluoroethyl acrylate), poly(2,2,3,3-tetrafluoropropyl acrylate), poly(2,2,3,3-tetrafluoropropyl methacrylate), poly(2,2,2-trifluoroethyl methacrylate), or a combination thereof.

2. The solar concentrator device according to claim 1, wherein the solar concentrator device has a color rendering index of greater than or equal to about 80.

3. The solar concentrator device according to claim 1, wherein the second refractive index is greater than or equal to about 1.05 to less than or equal to about 1.45.

4. The solar concentrator device according to claim 1, wherein the second refractive index is lower than the first refractive index by greater than or equal to about 0.1.

5. The solar concentrator device according to claim 1, wherein the first refractive index is greater than or equal to about 1.45 to less than or equal to about 2.5.

6. The solar concentrator device according to claim 1, wherein the solar concentrator device is flexible.

7. The solar concentrator device according to claim 1, wherein the photovoltaic component is either:
   a photovoltaic array that is either disposed onto a surface of the waveguide or embedded within the waveguide, or
   a photovoltaic cell dispose on at least one edge of the waveguide.

8. The solar concentrator device according to claim 1, wherein the luminophore is either embedded within the waveguide or disposed onto a surface of the waveguide as a layer.

9. The solar concentrator device according to claim 1, wherein the film has a tensile strength of greater than or equal to about 0.05 MPa.

10. The solar concentrator device according to claim 1, wherein the film has a Young's modulus of less than or equal to about 10 MPa.

11. The solar concentrator device according to claim 1, wherein the film has a Shore hardness of greater than or equal to about 40 D or a pencil hardness of greater than or equal to about 1H.

12. The solar concentrator device according to claim 1, wherein the film has a thickness of greater than or equal to about 0.1 μm to less than or equal to about 1 mm.

13. The solar concentrator device according to claim 1, wherein the film is an adhesive.

14. The solar concentrator device according to claim 1, wherein the film has an adhesive surface opposite to a surface of the film that is disposed onto the surface of the waveguide.

15. The solar concentrator device according to claim 14, further comprising:
    a sheet disposed onto the adhesive surface, wherein the sheet is configured to be peeled off of the solar concentrator device to expose the adhesive surface of the film.

16. The solar concentrator device according to claim 1, wherein the solar concentrator device is disposed onto a substrate with the film located between the substrate and the waveguide.

17. The solar concentrator device according to claim 16, wherein color coordinates of the substrate with the solar concentrator device are within about 50% of the color coordinates of the substrate alone.

18. The solar concentrator device according to claim 16, wherein the substrate is a surface of a vehicle, a billboard, a surface of a building, a mobile electronic device, or a surface of a greenhouse.

19. The solar concentrator device according to claim 18, wherein the substrate is the surface of the vehicle, the surface of the vehicle being curved.

20. The solar concentrator device according to claim 19, further comprising:
    a top coat disposed onto an exposed surface of the waveguide, wherein the top coat is transparent to visible and infrared light.

21. The solar concentrator device according to claim 1, further comprising:
    an adhesive layer disposed onto the film, wherein the film is located between the adhesive layer and the waveguide.

22. The solar concentrator device according to claim 1, wherein the waveguide has a refractive index of greater than or equal to about 1.45 to less than or equal to about 2.5.

23. The solar concentrator device according to claim 1, further comprising:
    a second solar concentrator device disposed onto the solar concentrator device, the second solar concentrator device comprising a second waveguide comprising a second luminophore, a second photovoltaic component operably coupled to the second waveguide, and a second film having a refractive index of greater than or equal to about 1.05 to less than or equal to about 1.45, the second waveguide, the second photovoltaic component, and the second film both being visibly transparent,
    wherein the second film is positioned between the solar concentrator device and the second solar concentrator device.

24. The solar concentrator device according to claim 1, further comprising:
a stack comprising a plurality of additional solar concentrator devices disposed onto the solar concentrator device on a surface opposite to the film,
wherein each of the plurality of additional solar concentrator devices comprises an additional waveguide comprising an additional luminophore, an additional photovoltaic component operably coupled to the additional waveguide, and an additional film having a refractive index of greater than or equal to about 1.05 to less than or equal to about 1.45, each of the additional waveguide, the additional photovoltaic component, and the additional film being visibly transparent, and
wherein no additional film is directly disposed onto another additional film.

25. The solar concentrator device according to claim 24, wherein the plurality of additional solar concentrator devices of the stack includes greater than or equal to 2 additional solar concentrator devices to less than or equal to 10 additional solar concentrator devices.

26. A solar concentrator device comprising:
a visibly transparent luminescent solar concentrator (TLSC) comprising a waveguide having a first refractive index, the waveguide having a first surface configured to directly receive light and a second surface opposite the first surface; and
a visibly transparent film disposed onto the second surface of the TLSC, the visibly transparent film being an adhesive and having an adhesive surface that is not disposed onto the surface of the TLSC and having a second refractive index, the visibly transparent film continuous across an entire surface of the waveguide,
wherein the second refractive index is lower than the first refractive index,
wherein the solar concentrator device is configured to be integrated onto a substrate by way of the adhesive surface of the visibly transparent film, and wherein the visibly transparent film comprises poly(1,1,1,3,3,3-hexafluoroisopropyl acrylate), poly(2,2,3,3,4,4,4-heptafluorobutyl acrylate), poly(2,2,3,3,4,4,4-heptafluorobutyl methacrylate), poly(2,2,3,3,3-pentafluoropropyl acrylate), poly(1,1,1,3,3,3-hexafluoroisopropyl methacrylate), poly(2,2,3,4,4,4-hexafluorobutyl acrylate), poly(2,2,3,4,4,4-hexafluorobutyl methacrylate), poly(2,2,3,3,3-pentafluoropropyl methacrylate), poly(2,2,2-trifluoroethyl acrylate), poly(2,2,3,3-tetrafluoropropyl acrylate), poly(2,2,3,3-tetrafluoropropyl methacrylate), poly(2,2,2-trifluoroethyl methacrylate), or a combination thereof.

27. The solar concentrator device according to claim 26, wherein the TLSC comprises luminophores that have a maximum peak absorbance in the UV, NIR, or IR and a maximum peak emission in the NIR or IR.

28. The solar concentrator device according to claim 26, wherein the TLSC comprises a photovoltaic cell or a photovoltaic array.

29. A method of fabricating a solar concentrator device, the method comprising:
obtaining a solar concentrator comprising a waveguide comprising a luminophore and having a first refractive index, and a photovoltaic component operably coupled to the waveguide, the waveguide having a first surface and a second surface opposite the first surface, the first surface configured to directly receive light; and
disposing a film onto the second surface of the solar concentrator, wherein the film has a second refractive index that is lower than the first refractive index of the waveguide, and the film is an adhesive having an adhesive surface, the film being continuous across an entire surface of the waveguide, the film comprising poly(1,1,1,3,3,3-hexafluoroisopropyl acrylate), poly(2,2,3,3,4,4,4-heptafluorobutyl acrylate), poly(2,2,3,3,4,4,4-heptafluorobutyl methacrylate), poly(2,2,3,3,3-pentafluoropropyl acrylate), poly(1,1,1,3,3,3-hexafluoroisopropyl methacrylate), poly(2,2,3,4,4,4-hexafluorobutyl acrylate), poly(2,2,3,4,4,4-hexafluorobutyl methacrylate), poly(2,2,3,3,3-pentafluoropropyl methacrylate), poly(2,2,2-trifluoroethyl acrylate), poly(2,2,3,3-tetrafluoropropyl acrylate), poly(2,2,3,3-tetrafluoropropyl methacrylate), poly(2,2,2-trifluoroethyl methacrylate), or a combination thereof,
wherein the waveguide and the film are visibly transparent, and
wherein the solar concentrator is configured to be integrated onto a substrate by way of the adhesive surface.

30. The method according to claim 29, wherein the disposing the film onto the surface of the solar concentrator comprises depositing the film onto the surface of the solar concentrator by glancing angle deposition or solution deposition.

31. The solar concentrator device according to claim 1, wherein the entire solar concentrator device is visibly transparent and has an average visible transmittance of greater than about 50%.

32. The solar concentrator device according to claim 1, wherein the entire solar concentrator device is visibly transparent and has an average visible transmittance of greater than about 75%.

* * * * *